US007733936B2

(12) United States Patent
Okamoto

(10) Patent No.: US 7,733,936 B2
(45) Date of Patent: Jun. 8, 2010

(54) SURFACE EMITTING LASER

(75) Inventor: Kohei Okamoto, Menlo Park, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 24 days.

(21) Appl. No.: 11/409,022

(22) Filed: Apr. 24, 2006

(65) Prior Publication Data
US 2007/0121694 A1  May 31, 2007

(30) Foreign Application Priority Data
Apr. 28, 2005 (JP) ............................. 2005-130718
Mar. 17, 2006 (JP) ............................. 2006-075055

(51) Int. Cl.
*H01S 5/00* (2006.01)
(52) U.S. Cl. .................. 372/50.124; 372/43.01; 372/50.11; 372/99
(58) Field of Classification Search ........... 372/50.124, 372/43.01, 50.11, 99
See application file for complete search history.

(56) References Cited
U.S. PATENT DOCUMENTS

| 6,154,480 | A  | * | 11/2000 | Magnusson et al. ........... 372/96 |
| 6,683,898 | B2 | * | 1/2004  | Østergaard et al. ........ 372/43.01 |
| 6,711,200 | B1 | * | 3/2004  | Scherer et al. ................ 372/64 |
| 6,804,283 | B2 | * | 10/2004 | Scherer ..................... 372/50.21 |
| 6,829,281 | B2 |   | 12/2004 | Deng et al. ..................... 372/96 |
| 2006/0024013 | A1 | * | 2/2006 | Magnusson et al. .......... 385/129 |

FOREIGN PATENT DOCUMENTS

| JP | 5-313220    | 11/1993 |
| JP | 8-51248     | 2/1996  |
| JP | 2000-332351 | 11/2000 |
| JP | 2003-114348 | 4/2003  |
| JP | 2003-273456 | 9/2003  |
| JP | 2004-521499 | 7/2004  |

(Continued)

OTHER PUBLICATIONS

Fan, S. et al., "Analysis of Guided Resonances in Photonic Crystal Slabs", *Physical Review B*, The American Physical Society, vol. 65, 235112, pp. 235112-1 to 235112-8 (Jun. 2002).

(Continued)

*Primary Examiner*—Minsun Harvey
*Assistant Examiner*—Kinam Park
(74) *Attorney, Agent, or Firm*—Fitzpatrick, Cella, Harper & Scinto

(57) ABSTRACT

There is provided a novel surface emitting laser structure unnecessary to have multilayer mirrors in both of upper and lower sides of an active layer. A surface emitting laser comprises a two-dimensional periodic structure which is comprised of an active material having a gain in a specific wavelength band of electromagnetic waves, and a reflecting mirror arranged apart by a predetermined distance so as to face the above-mentioned two-dimensional periodic structure, and these are comprised so as to make laser oscillation possible. At that time, the above-mentioned two-dimensional periodic structure is formed of a two-dimensional photonic crystal which is comprised of a dielectric, and a resonator is comprised of a reflecting mirror pair formed by combination with the above-mentioned reflecting mirror to make laser oscillation generated.

6 Claims, 12 Drawing Sheets

FOREIGN PATENT DOCUMENTS

| | | |
|---|---|---|
| WO | WO 02/073753 A2 | 9/2002 |
| WO | WO 2004/105094 A2 | 12/2004 |

OTHER PUBLICATIONS

Onomura, A. et al., " Densely Integrated Multiple-wavelength Vertical-cavity Surface-emitting Laser Array", Jpn. J. Appl. Phys., vol. 42, pp. L529-L531 (May 2003).

Mouette, J. et al., "Very Low Threshold Vertical Emitting Laser Operation in InP Graphite Photonic Crystal Slab on Silicon", *Electronics Letters*, vol. 39, No. 6, pp. 526-528 (Mar. 2003).

Park, S. et al., "Room-temperature GaN Vertical-cavity Surface-emitting Laser Operation in an Extended Cavity Scheme", *Applied Physics Letters*, American Institute of Physics, vol. 83, No. 11, pp. 2121-2123 (Sep. 2003).

Ohnishi, D. et al., "Room Temperature Continuous Wave Operation of a Surface-emitting Two-dimensional Photonic Crystal Diode Laser", *Optics Express*, Optical Society of America, vol. 12, No. 8, pp. 1562-1568 (Apr. 2004).

Danner, A.J. et al. "Coupled-defect Photonic Crystal Vertical Cavity Surface Emitting Lasers", Electronic Letters, 4th Sep. 2003, vol. 39, No. 18 (two sheets).

* cited by examiner

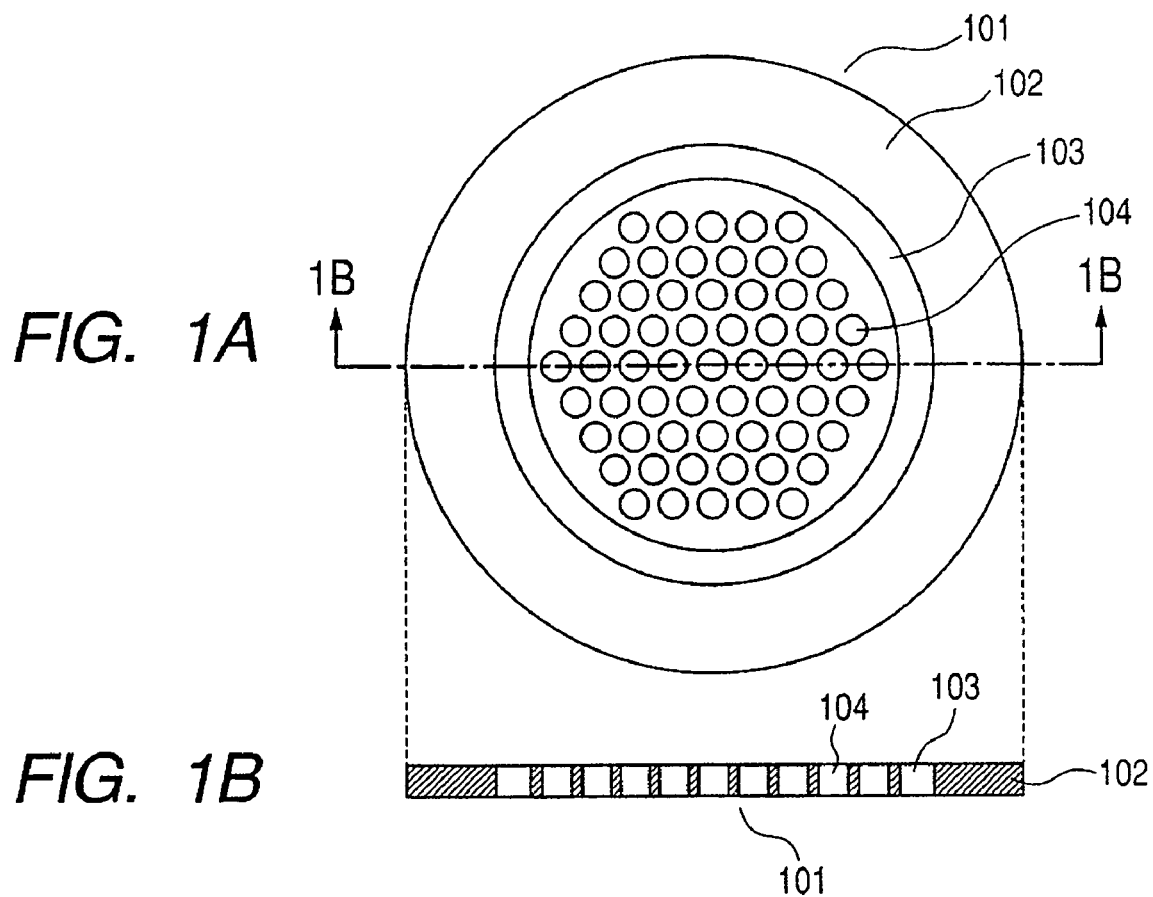
FIG. 1A
FIG. 1B
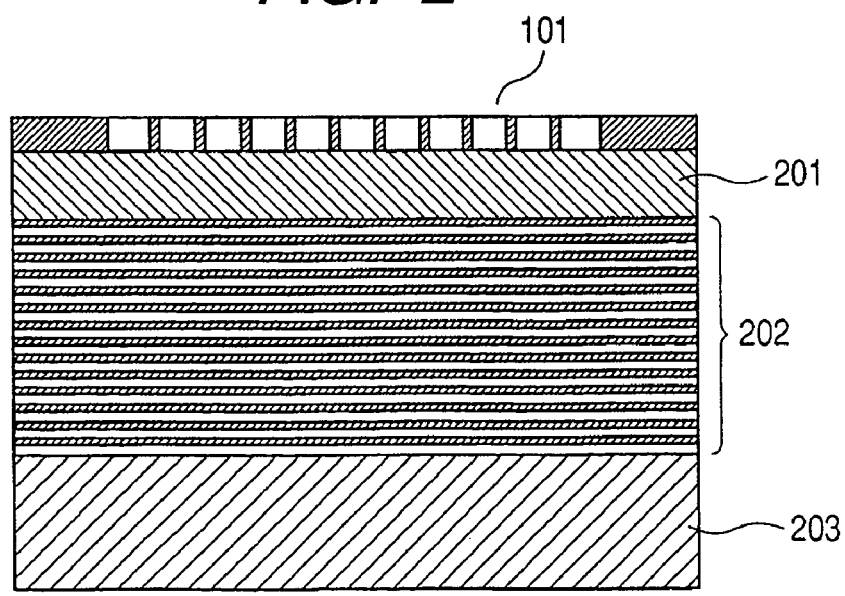
FIG. 2

FIG. 5
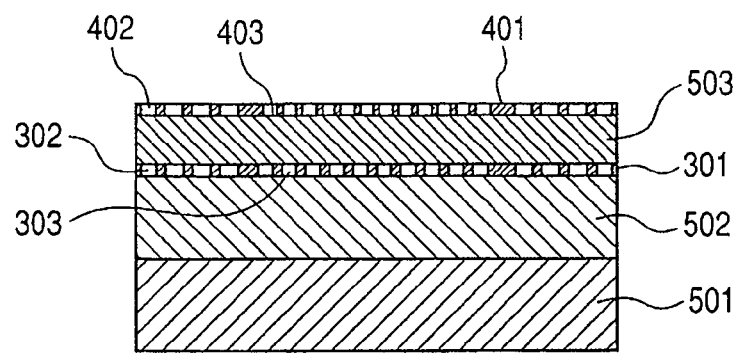
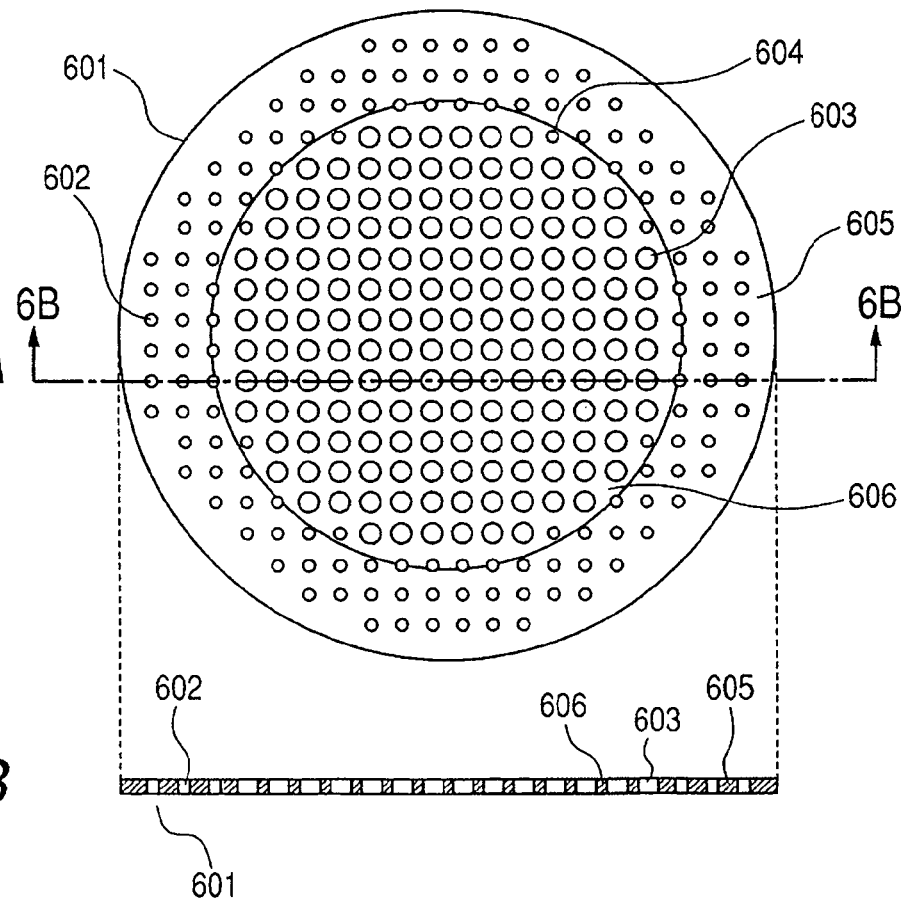
FIG. 6A
FIG. 6B

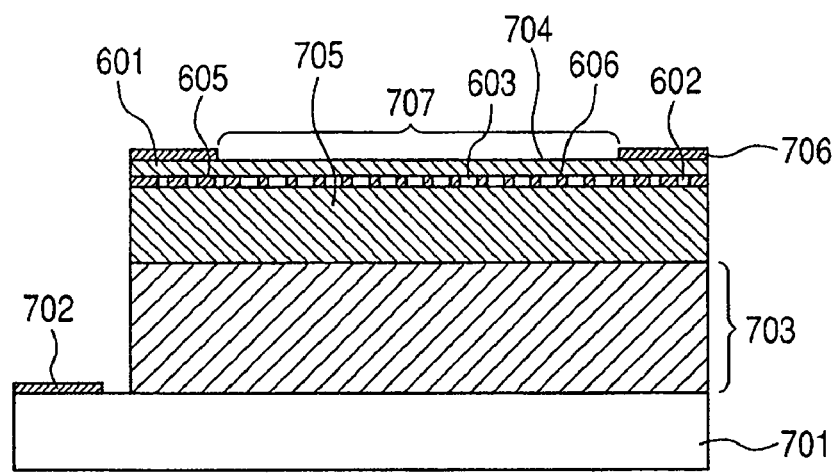
FIG. 7
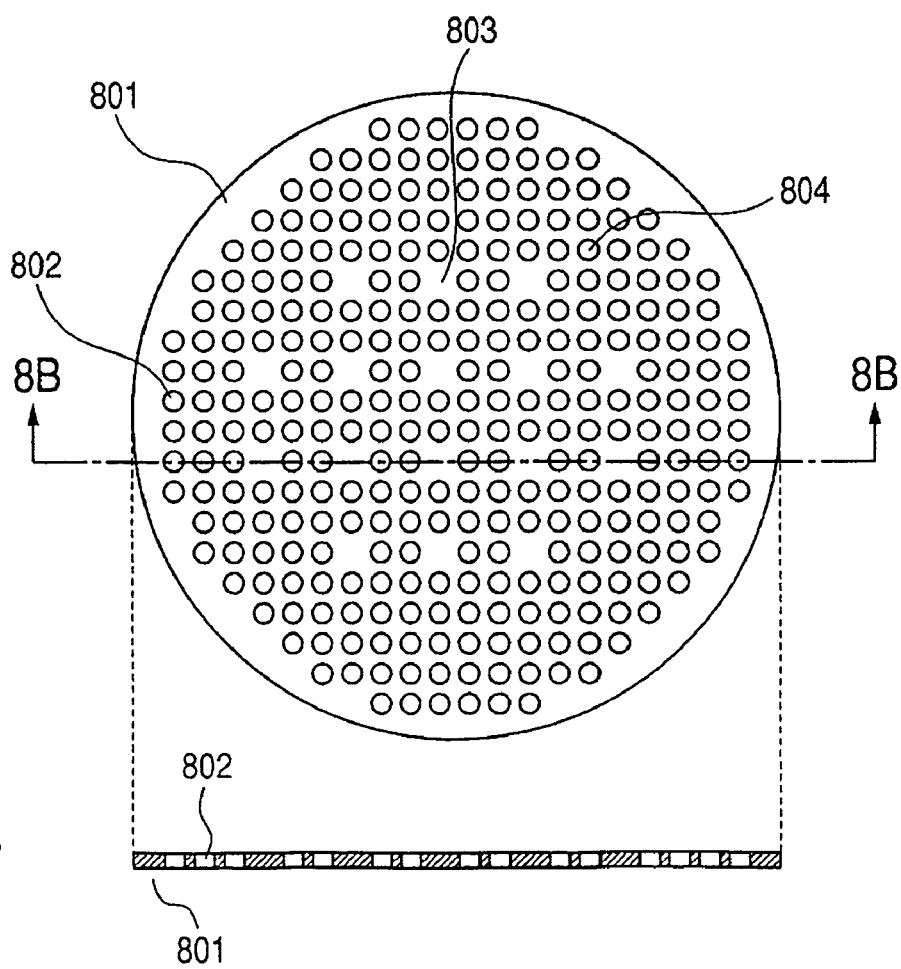
FIG. 8A
FIG. 8B

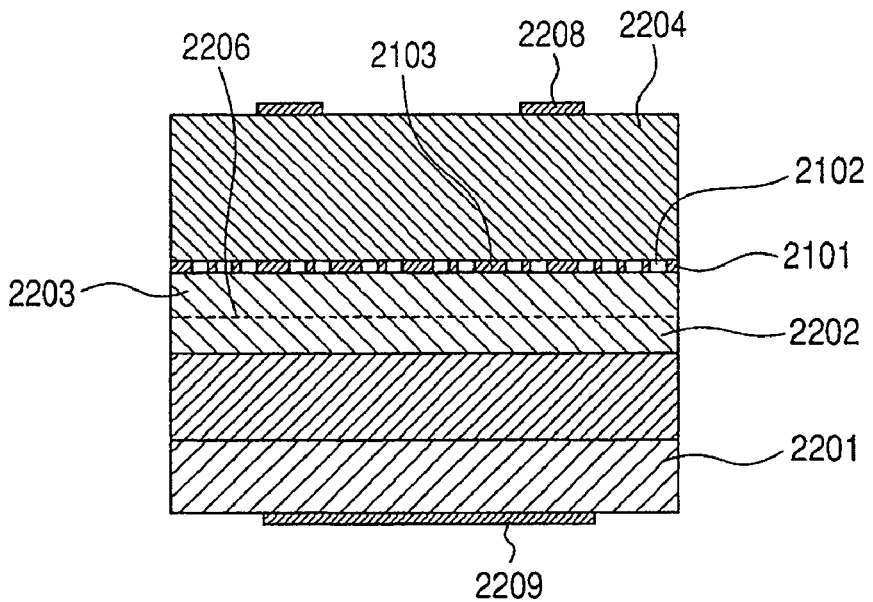
FIG. 20
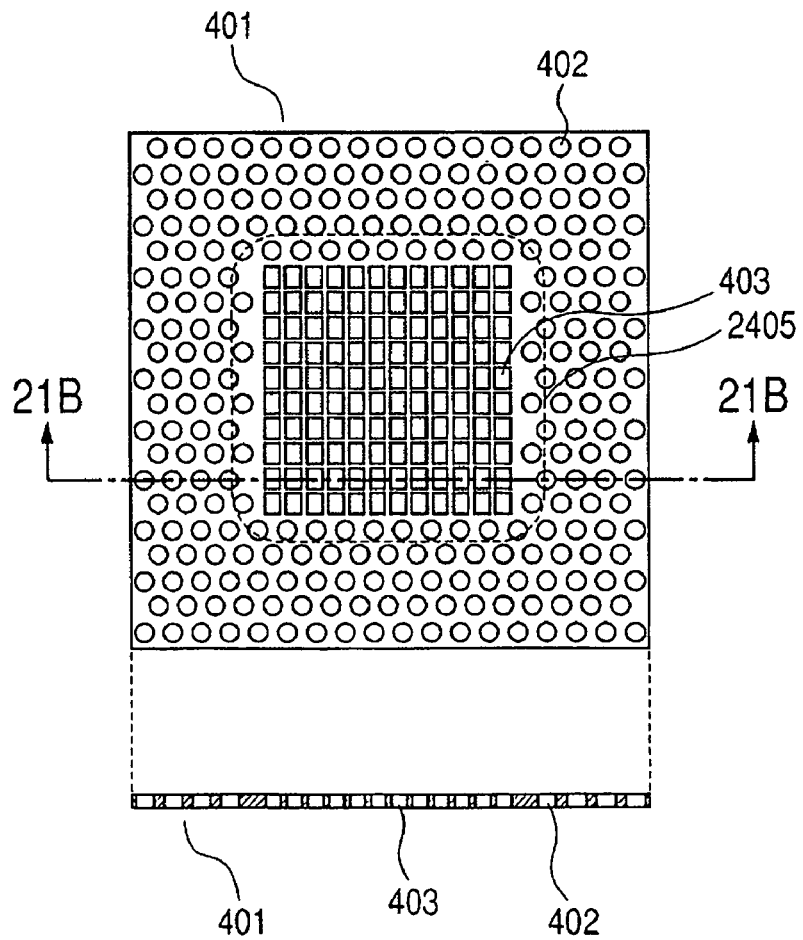
FIG. 21A
FIG. 21B

SURFACE EMITTING LASER

BACKGROUND OF THE INVENTION

1. Field of the Invention

The present invention relates to a vertical emitting laser. In particular, this relates to a vertical resonator type surface emitting laser in a semiconductor laser, a Vertical Cavity Surface Emitting Laser (VCSEL), and the like.

2. Related Background Art

Research of semiconductor lasers and EL devices which are small light sources has been done for many years. In particular, research of small and integrable surface emitting laser technology is energetically done for light on various wavelengths.

For example, Non-Patent Document 1 (Jpn. J. Appl Phys., Vol. 42, Pt. 2, No. 5B, L529) reports that a GaAs VCSEL array was made and continuous oscillation in the room temperature by current injection was achieved.

Generally, VCSEL is materialized by providing multilayer mirrors, which construct multilayer films respectively, in upper and lower sides of an active layer.

SUMMARY OF THE INVENTION

Nevertheless, in the case of using the multilayer mirrors described above as reflecting mirrors of upper and lower sides of an active layer, the following problems arise. That is, when multilayer mirrors are used for both of upper and lower sides of an active layer, a task that emission efficiency of heat generated in the active layer is low arises. When the efficiency of heat emission is low, as a result, a threshold of laser oscillation rises and it adversely affects property of a laser.

The present invention aims at providing a new laser without necessity of using at least one side of multilayer mirrors provided in both of upper and lower sides of an active layer.

According to an aspect of the present invention, there is provided a vertical resonator type surface emitting laser, comprising:

an active layer, and a first reflecting mirror provided oppositely to the active layer, wherein the active layer has a two-dimensional periodical structure where a refractive index in an in-plane direction of the active layer changes periodically so as to become a second reflecting mirror to an emission wavelength.

A spacer region is preferably provided between the first reflecting mirror and the active layer.

An emission window for emitting laser light to the external is preferably provided in the two-dimensional periodic structure.

The two-dimensional periodic structure and the first reflecting mirror preferably function as a vertical resonator in cooperation with each other.

The two-dimensional periodic structure preferably has a defect which disturbs periodicity of the periodic structure.

The first reflecting mirror is preferably comprised of a dielectric multilayer film.

The first reflecting mirror is preferably comprised of an active material which is comprised of a second two-dimensional periodic structure, and has a gain in a specific wavelength band.

The first reflecting mirror, or a region between the active layer and the first reflecting mirror is preferably comprised of a nonlinear optical material.

A means of making a gain distribution generated is preferably provided in the active layer.

A second active layer which is preferably comprised of an active material and does not have two-dimensional periodical structure between the active layer and the first reflecting mirror is provided.

According to the present invention, since the active layer itself functions as a vertical mirror, it becomes unnecessary to provide multilayer mirrors in both of upper and lower sides of an active layer.

BRIEF DESCRIPTION OF THE DRAWINGS

FIGS. 1A and 1B are a diagram showing structure of a photonic crystal slab in a first example of the present invention with structure of a cross-section taken on line 1B-1B in FIG. 1A;

FIG. 2 is a diagram showing structure of a vertical emitting laser in the first example of the present invention;

FIG. 5 is a diagram showing structure of a vertical emitting laser in the second example of the present invention;

FIGS. 6A and 6B are a diagram showing structure of a photonic crystal slab in a third example of the present invention with structure of a cross-section taken on line 6B-6B in FIG. 6A;

FIG. 7 is a diagram showing structure of a vertical emitting laser in the third example of the present invention;

FIGS. 8A and 8B are a diagram showing structure of a photonic crystal slab in a fourth example of the present invention with structure of a cross-section taken on line 8B-8B in FIG. 8A;

FIG. 20 is a schematic diagram for explaining an embodiment of the present invention; and FIGS. 21A and 21B are schematic diagrams for explaining an embodiment of the present invention.

Figure 3A:
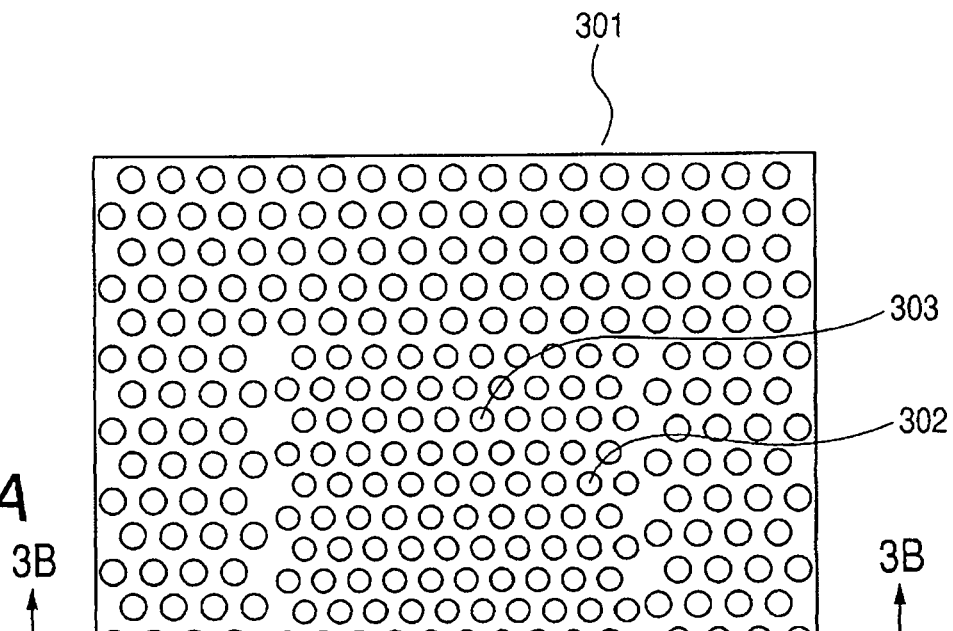
FIGS. 3A and 3B are a diagram showing structure of a photonic crystal slab in a second example of the present invention with structure of a cross-section taken on line 3B-3B in FIG. 3A.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

DETAILED DESCRIPTION OF THE PREFERRED EMBODIMENTS

First, a vertical resonator type surface emitting laser according to a first present invention will be explained using FIG. 2. In the figure, reference numeral 203 denotes a substrate, reference numeral 202 denotes a reflecting mirror layer, reference numeral 201 denotes a spacer layer, and reference numeral 101 denotes an active layer. Although specific materials are described in the diagram, they are just exemplification to the last. In the present invention, although a multilayer mirror is used as a reflecting mirror in a lower portion of an active layer, two-dimensional periodic structure which functions as a vertical reflecting mirror is provided on the active layer itself without using a multilayer mirror as an upside reflector.

In addition, it is possible to use the above-mentioned two-dimensional periodic structure also as a reflecting mirror in a lower portion of the active layer.

Furthermore, as a substrate 203, it is an InP substrate, for example. As the reflecting mirror 202, a multilayer mirror (DBR) which is constructed of, for example, combination of AlGaInAs/InP is suitable. As the spacer layer 201, for example, InAlAs is suitable. It is good to use a material, whose refractive index is lower than that of the active layer 101 (e.g., this is constructed of 40QW of AlGaInAs/InP) as the spacer layer. The spacer layer is also used for adjusting cavity length.

Next, two-dimensional periodic structure will be explained in full detail below.

(Two-Dimensional Periodic Structure)

The two-dimensional periodic structure means periodic structure where a dielectric constant or a refractive index has periodic distribution in an in-plane direction parallel to a certain face. In recent years, it is also called a two-dimensional photonic crystal.

In addition, the period is in the order of a wavelength of light (electromagnetic waves) to be handled. For example, when handling light on a wavelength of 1 μm, its period such as 500 nm, 1 μm, and 1.2 μm depends also on the wavelength of light, and a refractive index (dielectric constant) of its material which constructs the periodic structure.

A two-dimensional photonic crystal is mentioned as an example of the two-dimensional periodic structure. Specifically, a filmy two-dimensional slab photonic crystal, in which square, round, or triangular air holes are provided in a two-dimensional period, or the like is used. It is also possible to fill the air holes with a material having a dielectric constant different from the surroundings.

In addition, various things such as periodic arrangement of minute balls in a period of the order of a wavelength of light, and an array of minute columns are mentioned as examples of the two-dimensional photonic crystal.

Under these circumstances, periodicity, a material, a shape, size, and the like of a two-dimensional periodic structure of the present invention are designed so that light emitted therein may be emitted in a direction perpendicular to its two-dimensional face and to a side of the light being incident.

On the other hand, when a reflecting mirror is provided in a position, which faces the two-dimensional periodic structure, apart in a predetermined distance, most of the light emitted from the two-dimensional periodic structure is reflected by the reflecting mirror (for example, 202 in FIG. 2), and returns to the two-dimensional periodic structure again.

Fundamentally, the predetermined distance means a distance which is n/2 (n is a natural number including 0) times the wavelength of light to be handled. It is a distance set in consideration of refractive indices (dielectric constants) of the two-dimensional periodic structure and reflecting mirror, and leakage of light.

As mentioned above, when exciting the two-dimensional periodic structure, which is constructed of an active material, by a certain method, the light having returned from the reflecting mirror 202 is again amplified in the two-dimensional periodic structure 101, and can achieve laser oscillation.

In addition, excitation means will be mentioned later.

A two-dimensional periodic structure which has a high reflectivity is constructed of a two-dimensional photonic crystal having periodical structure of a dielectric. Then, the two-dimensional photonic crystal concerned is designed so that modes in a photonic crystal and modes of external light may couple together.

When the light having returned to the two-dimensional periodic structure by having been reflected by the reflecting mirror 202 is again emitted to the reflecting mirror from the two-dimensional periodic structure, the two-dimensional periodic structure 101 and the reflecting mirror 202 become combination of a reflecting mirror pair. That is, a vertical resonator is constructed.

It is possible to generate laser oscillation with a part of wavelengths included in wavelengths emitted by the two-dimensional periodic structure by exciting the two-dimensional periodic structure by any method to achieve a population inversion state.

In addition, it is also possible to materialize a two-dimensional periodic structure having a high reflectivity by, for example, selecting metal as a material and using resonance of light incident from the external and plasmon in the periodical structure of the metal.

In addition, it is sufficient for a two-dimensional periodic structure applied to the present invention to have refractive indices two-dimensionally changing in turn. Such a periodicity of the refractive indices may be a three-dimensional.

It is sufficient for the periodic structure of the present invention to be located opposite to the multilayer mirror on one side and have a refracting function in the vertical direction in the same way as the multilayer mirror.

Hereafter, photonic band structure which a photonic crystal has will be explained further in full detail.

(Photonic Band Structure)

One feature of the vertical emitting laser according to the present invention is to construct periodical structure of a two-dimensional periodic structure of a photonic crystal.

Figure 10A:
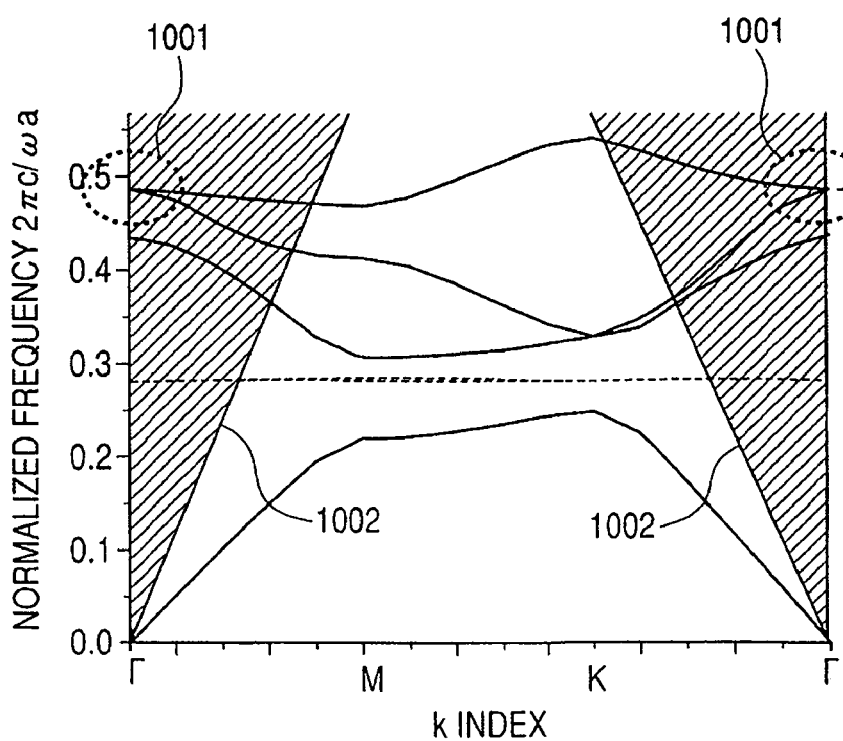
FIGS. 10A and 10B are explanatory diagrams of structure of a photonic band in the first example of the present invention.
Figure 10B:
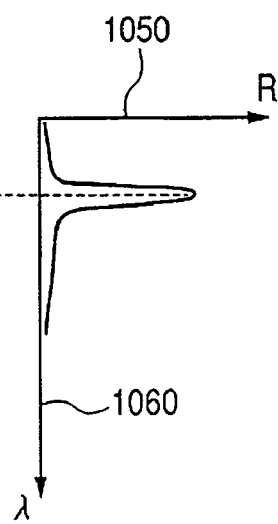

A photonic crystal has photonic band structure associated with a frequency of electromagnetic waves, and a wave number vector, as shown in FIGS. 10A and 10B.

In other words, a two-dimensional photonic crystal has dispersion relation between a wave number vector and a normalized frequency ($\omega a/2\pi c$: $\omega$ denotes an angular frequency of light, a denotes a grating constant of a photonic crystal, and c denotes velocity of light in vacuum) of light.

Then, this dispersion relation is called photonic band structure or a photonic band diagram.

Modes of electromagnetic waves in connection with laser oscillation are described outside light lines 1002 in the above-mentioned photonic band structure.

The two-dimensional periodic structure 101 is formed in a limited region in a direction perpendicular to its face as shown in FIG. 2, and can be called a slab type two-dimensional photonic crystal.

There is a region, which easily couples with a mode outside a slab which is called an emission mode, in the photonic band structure in such a photonic crystal.

The above-mentioned region is located in an upper side (outside) of the light lines 1002 in FIGS. 10A and 10B. The present invention uses a mode (for example, circles 1001 shown in a dotted line in FIGS. 10A and 10B) described as an emission mode among modes in bands in the photonic band structure.

Because of this, it becomes possible to make a two-dimensional photonic crystal slab function as a reflecting mirror having high reflection property.

Reflection property of light in the emission mode is conceptually shown in a right side of FIGS. 10A and 10B using a graph. Reference numeral 1060 denotes a wavelength λ, and R of reference numeral 1050 denotes reflectivity and shows relation between the wavelength of light vertically incident in an in-plane direction of the photonic crystal slab, and the reflection property. That is, in a mode where group velocity of light is near zero, there is a wavelength which becomes an extremely high reflectance. Such a phenomenon can be called a Guided Resonance effect. The present invention is designed so that external light which is incident into a photonic crystal slab may be converted into an emission mode in a band of the photonic band structure.

Thereby, the light which is incident at right angle in the in-plane direction of the photonic crystal slab is once converted into a two-dimensional mode. Nevertheless, since this mode is the emission mode, it is converted into the external light again.

In addition, when the mode handled in the photonic band structure is a mode having group velocity of light very near 0, the light converted into the two-dimensional mode in the two-dimensional photonic crystal becomes almost a standing wave.

Therefore, it interacts with carriers in the photonic crystal, which constructs an active layer, very strongly. In addition, since the modes are aligned over a whole two-dimensional face of the two-dimensional photonic crystal, it is possible to achieve emission of laser light in a large area the modes of which are aligned in the face.

It is also considerable that the laser resonator of the present invention comprises at least the following two resonators. That is, they are a vertical resonator formed of an active layer having two-dimensional periodical structure, and a reflecting mirror arranged oppositely, and a resonator formed in an in-plane direction of two-dimensional periodical structure.

When the photonic crystal as the two-dimensional periodic structure is in an excitation state by a certain method, it is possible to perform highly efficient magnification or induced emission of light by the above-mentioned interaction.

However, since the light in the two-dimensional mode is an emission mode, it is emitted to the external in very short time. Nevertheless, by returning the light repeatedly to the photonic crystal with a reflecting mirror, it becomes possible to suppress spontaneous emission light in the photonic crystal to materialize a highly efficient laser.

A design of structural parameters of the two-dimensional photonic crystal slab itself is determined by a dielectric constant (refractive index) of an active material, a wavelength band of a gain, a wavelength of laser oscillation, a material around a photonic crystal, and the like. For example, in the case of a material without a gain, it is described in Phys. Rev. B, Vol. 65, 235112. Specifically, there is an example of the two-dimensional photonic crystal which is constructed of cylindrical holes on a square grating. It is also possible to apply such a design trend to a design of a photonic crystal which is constructed of a material with a gain.

(Introduction of Defects Disturbing Periodicity)

It is also possible to provide defects, which disturb periodicity, in the above-mentioned two-dimensional periodic structure. It is possible to control a mode and a wavelength, or an emitting region of laser light by introducing such defect structure.

As the defect, structure with any shape is also possible so long as it is local structure which disturbs periodicity in the periodic structure of two-dimensional periodic structure. For example, when one cylindrical hole does not exist locally in a two-dimensional photonic crystal in which cylindrical holes are arranged periodically in a shape of a triangular lattice, and which is constructed of Si, a region where this cylindrical hole lacks becomes a defect. In addition, when size of one cylindrical hole is larger than that of the surroundings, this region becomes a defect. Any size and shape of defect is sufficient, and there are point-like, linear, and other defect structures.

When a photonic band gap (1101 in FIG. 11) which a photonic crystal has includes a gain wavelength band of the active layer, it is possible to confine only the light on a wavelength equivalent to a defective level in a defect portion very strongly by introducing the above-mentioned defect structure. That is, since it becomes easier to control a wavelength and a mode of laser oscillation, it is possible to materialize a highly efficient surface emitting laser.

(Introduction of a Plurality of Defects)

In addition, it is also possible to introduce the plurality of above-mentioned defects. When making regions emitting light in respective defective modes optically coupled in the case of emitting light in defectives mode according to the defects introduced, it is possible to obtain a surface emitting laser with aligned modes also when an emission area is enlarged.

For example, defects periodically provided in a photonic crystal are provided at intervals of one per m periods of the photonic crystal in its plane. It is recommendable for respective defects to be the same size and shape. For example, a two-dimensional photonic crystal slab where cylindrical holes are arranged periodically in two dimensions in a shape of a square lattice in a GaAs thin film is made to be in a state that cylindrical holes do not exist in a location where they should originally exist. Then, they are arranged at intervals of one per five periods in the periodical structure of the photonic crystal. When a gain wavelength band of an active material which constructs a photonic crystal is in a photonic band gap, light emitted from the active material cannot exist in the photonic crystal. However, since a defective level arises in the photonic band gap because of the periodic defects, only the light on a wavelength equivalent to this level can exist in the photonic crystal. It is possible to control a wavelength and a mode of light in connection with laser oscillation by using this. In addition, when arranging periodic defects so that light corresponding to respective defective modes of the periodic defects may couple with each other, only the light on the wavelengths and in the modes equivalent to the coupled defective levels is selected, and laser oscillation can be generated.

Figure 11:
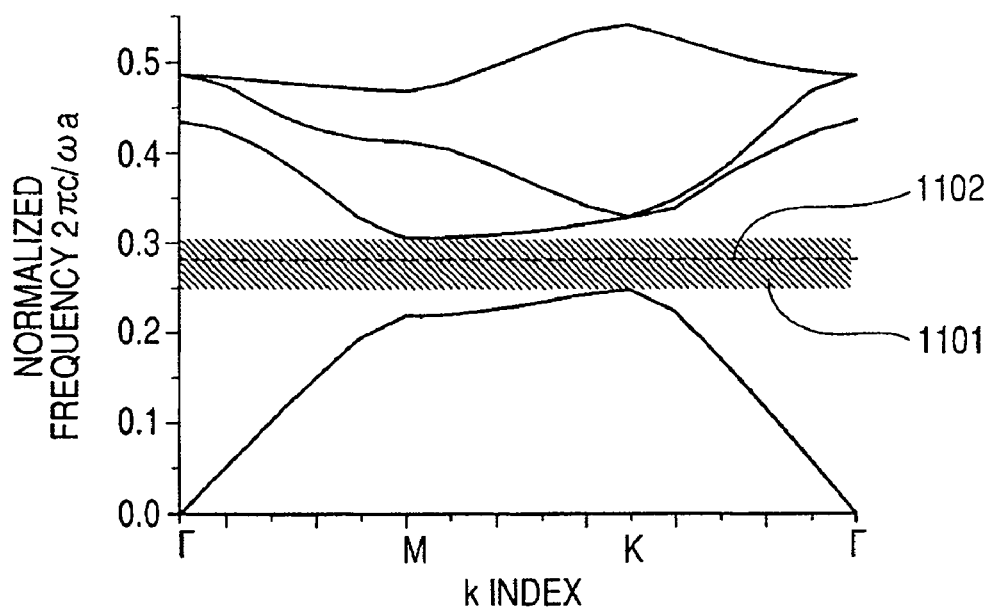
FIG. 11 is an explanatory diagram of a defective band in an embodiment of the present invention.
Figure 12:
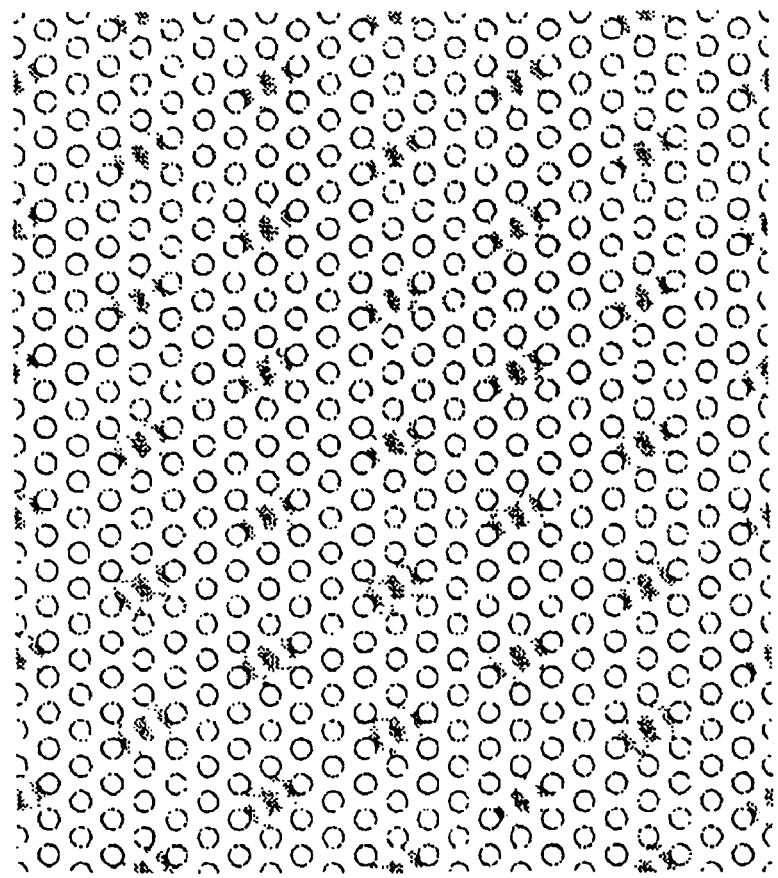
FIG. 12 is a diagram showing an example of a defective (coupling) mode in an embodiment of the present invention.

FIG. 11 shows a structural example of the photonic band structure of the photonic crystal in which the cylindrical holes in the triangular lattice in which the periodic defects are provided are arranged. It turns out that a defective (coupling) band 1102 which is constructed in the photonic band gap 1101 in the photonic band structure by a plurality of defects combining appears. In addition, FIG. 12 shows an example of an electric field intensity distribution in the resonance mode resulting from the defective band in this structure. Since combination of defects occurs over the entire region, where the periodic defects are arranged, in the photonic crystal, it is possible to materialize single-mode laser oscillation in this region.

(Active Layer)

The vertical emitting laser according to the present invention uses a two-dimensional periodic structure which is constructed of an active material having a gain in a specific wavelength band of electromagnetic waves. The electromagnetic waves includes X-rays, deep ultraviolet (DUV) rays, ultraviolet (UV) rays, visible light, infrared rays, far infrared rays, terahertz light, microwaves, and the like.

An active material used as an active medium of a light emitting device such as a laser has an emission spectrum peculiar to band structure. Then, a wavelength band of a light emission peak with certain width in the emission spectrum is used in a light emitting device. In addition, the specific wavelength band of light (electromagnetic waves) in the present invention means a wavelength band contributing to emission of the device when constructing the device using the active material. Furthermore, according to types of materials, various things are considerable as such a wavelength band. For example, in the case of $In_{1-x}Ga_xN$, it is possible to control a wavelength of a gain from an ultraviolet region to light on a wavelength equivalent to yellow according to a value of x. In addition, also when using other semiconductor materials, it is possible to select various wavelengths according to their types, and it is also possible to use an organic material and the like. It is possible to make the active layer according to the present invention emit light by exciting the active layer using excitation means such as light, a current, or heat.

In addition, in the present invention, it is also possible to perform configuration so that a gain distribution may occur in the above-mentioned active layer.

Hereafter, specific explanation will be performed. When making an excitation state of the active layer itself or the active material constructing the active material have a gain distribution distributed spatially, it is possible to achieve efficient recombination of electrons and holes and also to increase controllability of light modes.

An active material changes to an excitation state by excitation caused by specific energy to emit light in a specific wavelength band. In the active material given the gain distribution, a large gain portion and a small gain portion are formed, and hence, actually, a region which does not emit light even if being excited arises. For example, a portion into which carriers can flow is restricted when partially forming a region of blocking carriers. Hence, the recombination of carriers contributing to emission is controlled spatially. As a result, injection efficiency of the carriers also increases. In addition, as mentioned later, when a reflecting mirror arranged in a position facing the active layer is constructed of an active material, it is possible to give a gain distribution to the reflecting mirror concerned.

In order to give the gain distribution, for example, a carrier block layer is provided as follows. A carrier block layer is formed by proton injection or the like so as to perform current stricture without causing the large change of a real part of a refractive index.

According to methods such as the proton injection, it is possible not only to form a carrier block layer selectively in a device, but also to be necessary hardly to change a real part of a refractive index of the material. Hence, it is possible to form paths of carriers selectively without changing light confinement structure and light modes. In particular, by using current stricture structure, it is possible to suppress leakage of carriers, unnecessary recombination process, unnecessary emission in the active material, and the like.

In addition, in order to achieve the gain distribution, it is also possible to devise an electrode for current injection. Here, as electrode materials, various materials such as ITO, Ti, Au, and Pt are mentioned.

As carrier injection means, it is also possible to use a plurality of electrode pairs.

Here, an electrode pair means combination of an electron injection electrode for injecting electrons into an active material, and a hole injection electrode for injecting holes. It is not necessary to provide the electron injection electrode and hole injection electrode in one-to-one correspondence. For example, configuration of three hole injection electrodes to one electron injection electrode is also possible, and such a case is called three electrode pairs. It becomes possible to excite the active material partially by providing the plurality of electrode pairs. That is, it is possible to give the gain distribution to a portion which is constructed of the-active material.

In addition, when the plurality of electrode pairs are arranged regularly, it is possible to control a direction and the like of laser light emitted. Furthermore, it is possible to control independently a direction, luminous intensity, and the like of laser light by providing control means for making a current amount which flows through each electrode pair, and a voltage between electrodes independent.

(Emission Window)

In the vertical emitting laser of the present invention, it is also possible to provide an emission window for radiating electromagnetic waves to the external. Any form of emission window is sufficient so long as it is possible to radiate laser light to the external.

For example, in a vertical emitting laser constructed with including an active layer having two-dimensional periodical structure, and a reflecting mirror, it is possible to construct an emission window as follows. For example, it is also sufficient to radiate partially laser light using a circular electrode as an electrode for current injection, or to use a clear electrode.

(Reflecting Mirror)

In the present invention, although it is possible to use two-dimensional photonic crystals as both of two reflecting mirrors, a reflecting mirror located in a side of facing an active layer may be constructed of a dielectric multilayer film. A dielectric multilayer film is a film formed by laminating periodically two thin films, refractive indices of which differ from each other, by turns, and the more a number of lamination is or the larger refractive index difference is, the higher reflectance can be made. For example, it is a distributed Bragg reflector (DBR) of InGaAlAs/InAlAs in a 1.55-µm wavelength band. In addition, it is a DBR of GaAs/AlGaAs in an 850-nm band. Furthermore, it is a DBR of AlGaN/GaN or a DBR of $SiO_2/ZrO_2$ in nearly 400 nm.

In addition, it is also possible to construct the reflecting mirror itself, arranged oppositely to the active layer, of a two-dimensional photonic crystal. In addition, hereafter, periodical structure provided in an active layer may be called first two-dimensional periodical structure, and periodical structure provided in the above-mentioned reflecting mirror may be called second two-dimensional periodical structure.

In regard to a design of structure of a photonic crystal, a material, and the like, it is also possible to apply the technical matters mentioned already about the photonic crystal which is provided in an active layer, and also to introduce a defect. In addition, when a reflecting mirror arranged oppositely to an active layer has periodical structure, it is also possible to construct the reflecting mirror of an active material having a gain in a specific wavelength band. That is, the two layers which function as vertical reflecting mirrors are arranged apart by a predetermined interval. In this case, optical amplification or induced emission is achieved in the two layers (being constructed of gain media and having two-dimensional periodical structure) concerned, respectively. Furthermore, it is also possible to stabilize modes of laser light by aligning the modes of light emitted by both. Means of exciting both may be any of optical pumping, current injection, cathode luminescence, and thermal excitation, and is not limited to these.

(Carrier Injection Means)

In the vertical emitting laser according to the present invention, it is possible to provide carrier injection means for injecting carriers. For example, it is possible to operate the laser of the present invention by providing an electrode (carrier injection means) for current injection. As electrode materials, various materials such as ITO, Ti, Au, and Pt are mentioned. In addition, when structure, a shape, and size of the electrode are sufficient for laser light being emitted to the external in a resonant direction perpendicular to a face, there is no restriction. For example, it is conceivable to form the first two-dimensional periodical structure and second two-dimensional periodical structure of active materials. A two-dimensional photonic crystal slab of InGaN where cylindrical holes in a square lattice are arranged periodically on p-GaN as an active layer is prepared. Furthermore, two structures constructed of forming n-GaN are bonded together on it so that n-GaN may face each other. Then, current injection becomes possible by connecting the n-GaN layer to an electron injection electrode, and connecting two p-GaN layers to a hole injection electrode. In addition, for example, with exposing the n-GaN layer, Ti/Al/Ti/Au is vapor-deposited on n-GaN as an N type electrode. As a P type electrode, a Mo/Pd thin film region hollowed circularly is arranged on a top face of a resonator as an emission window, and to arrange a Mo/Pd thin film without an emission window on a lower face of the resonator.

(Spacer Layer Between Active Layer and Reflecting Mirror)

It is also possible to construct a region between an active layer, which has two-dimensional periodical structure, and a reflecting mirror, or the reflecting mirror itself of a nonlinear optical material. By the structure concerned, it becomes possible to make nonlinear effects, such as wavelength conversion, exerted. For example, when the material which fills the region between an active layer and a reflecting mirror is a nonlinear optical material, a part of laser light is converted into a second harmonic (SHG light) in the region. Most fundamental waves cannot transmit the active layer and reflecting mirror. Since a wavelength of SHG light is half of a wavelength of a fundamental wave, it is out of a wavelength band which the two-dimensional periodic structure and reflecting mirror can reflect to be able to transmit them. That is, it is possible to materialize a wavelength conversion laser device. In addition, structure is as follows in the case of using a two-dimensional photonic crystal slab, which is constructed of a nonlinear optical material as a reflecting mirror arranged oppositely to an active layer. In consideration of occurrence of a second harmonic, light emitted from the active layer is incident into the reflecting mirror, and a part of the light is converted into two-dimensional mode light in a plane of the reflecting mirror. When phase matching is achieved in the two-dimensional plane, a part of the fundamental waves with a two-dimensional mode is converted into SHG light. When a mode of the SHG light is inside (below) light lines of the photonic band structure, the light propagates in a direction parallel to a plane of the slab to be emitted outside. But, when it is outside (above) the light lines, it is vertically emitted to the face.

In addition, it can also provide the layer which is constructed of active materials in an above-described spacer layer region (201 of FIG. 2). In this case, it will have a second active layer which is provided in the active layer (101 of FIGS. 1A and 1B) in which refractive index periodic structure was formed, and spacer bounds, and does not comprise refractive index periodic structure, and a reflecting mirror (for example, multilayer mirrors as shown in FIG. 2).

When gain regions run short by providing periodical structure (for example, pore) in an active layer, it is effective at the point of compensating a gain region.

(Misc.)

Property of two-dimensional periodic structure may improve by laminating and constructing a plurality of films with relation, such as the material and wavelength of the light to handle. For example, what laminated the dielectric multilayer film, and the thing which laminated a plurality of thin films which have two-dimensional periodic structure are mentioned to the thin film of one sheet which has two-dimensional periodic structure. When laminating a plurality of thin films which have two-dimensional periodical structure, there is no need that the two-dimensional periodical structure of a plurality of thin films is equal to mutual, and the materials may also differ. For example, when one thin film is what reflects TE polarized light and another thin film is what reflects TM polarized light, it is possible to achieve high reflectance to every polarized light.

EXAMPLES

Examples of the present invention will be described below. In addition, in the following examples, semiconductor processes, such as photo lithography using a stepper (semiconductor exposing apparatus) or electron beam lithography, and dry etching, are used for production of two-dimensional periodic structure.

Example 1

FIGS. 1A and 1B show structure of a photonic crystal slab in this example with structure of a cross-section taken on line 1B-1B. In addition, FIG. 2 shows cross-sectional structure of a vertical emitting laser in this example. As shown in FIG. 2, the vertical emitting laser of this example forms a distributed Bragg reflector (DBR) 202 where 30 periods of AlGaInAs/InP thin films are laminated by crystal growth technology on an InP substrate 203. A spacer which is constructed of InAlAs is arranged thereon.

On the spacer 201, the photonic crystal slab 101 which has multiple quantum well (MQW) structure of AlGaInAs/InP near a center in a depth direction (thickness is made to be about 300 nm).

In this example, the photonic crystal slab 101 corresponds to the above-mentioned two-dimensional periodic structure. Then, the DBR 202 is the reflecting mirror, and in order to secure a predetermined distance, the spacer 201 at about 440 nm thick is provided.

As shown in FIGS. 1A and 1B, cylindrical holes 104 are periodically arranged two-dimensionally in a shape of a triangular lattice in an in-plane direction parallel to a face of the photonic crystal slab 101. Light in the photonic crystal is confined internally by interface reflect by a groove 103 being formed around it.

In addition, the external of the groove 103 becomes a non-periodical region 102 in which periodical structure is not formed. A diameter of the groove 103 is about 20 μm.

Since this photonic crystal slab 101 has multiple quantum well structure of AlGaInAs/InP, when excited by light or the like, it radiates light in a wavelength band centering on about 1.53 μm to emit light. In addition, the photonic crystal is designed so as to emit light in this wavelength band in a direction perpendicular to the face. In particular, when light in nearly 1.53 μm is incident at right angle to a face, the light is converted into a two-dimensional in-plane mode and is once again emitted vertically. Hence, seemingly nearly 100% of reflection occurs.

Although FIGS. 10A and 10B show the photonic band structure of this photonic crystal, a mode within a band in the vicinity shown by a dotted circle 1001 in FIGS. 10A and 10B is used. Around this, since the band has an external value, its inclination is extremely small, that is, 0. Thus, it is a mode that group velocity of light becomes 0 or very small, and it is possible to form a standing wave, where only one mode exists in a two-dimensional face, by using this mode. Since existing in an upper part (outside, hatched region) than light lines 1002 in the photonic band structure in FIGS. 10A and 10B, that is, a high-frequency side, this mode becomes an emission mode, and this light is easier to couple with external light. For this reason, light from the external is once converted into a standing wave in the photonic crystal slab, and is immediately emitted to the external again. Hence, property as a reflecting mirror occurs.

In particular, since being constructed of an active material, the photonic crystal slab 101 having two-dimensional periodic structure emits light in a wavelength band corresponding to a band gap of the material by an excitation light being incident.

In FIG. 2, it excites the photonic crystal slab 101 by being incident in excitation light at right angles to a face from the lower portion of the InP substrate 203. Spontaneous emission occurs with light having a wavelength and a mode which are mainly selected according to structure of the photonic crystal in the excited photonic crystal slab 101, which exists as a standing wave in the mode permitted in the face. When the photonic crystal slab 101 is fully excited and is in a population inversion state, it may perform amplification or laser oscillation in the two-dimensional plane as it is. The light in the two-dimensional standing wave state occurred in this way is emitted in a direction perpendicular to an in-plane direction, and is incident into the DBR 202 arranged oppositely. The light is reflected by the DBR 202 and is incident into the photonic crystal slab 101 again, and optical amplification occurs similarly to the above-described. Further, laser oscillation occurs by using as a cavity the reflecting mirror pair which is constructed of the photonic crystal slab 101 and DBR 202. According to this example, since one side of the two reflecting mirrors which form a reflecting mirror pair in this way functions as an active layer, it becomes advantageous extremely also in production.

Example 2

Figure 3B:
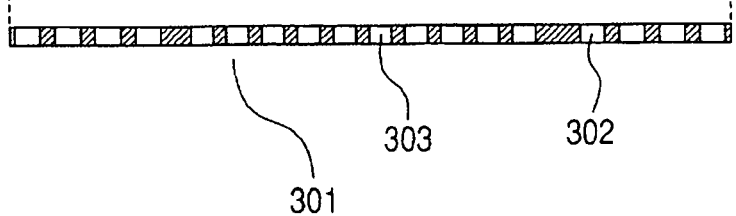

FIGS. 3A and 3B show structure of a photonic crystal slab in this example with structure of a cross-section taken on line 3B-3B.

Figure 4A:
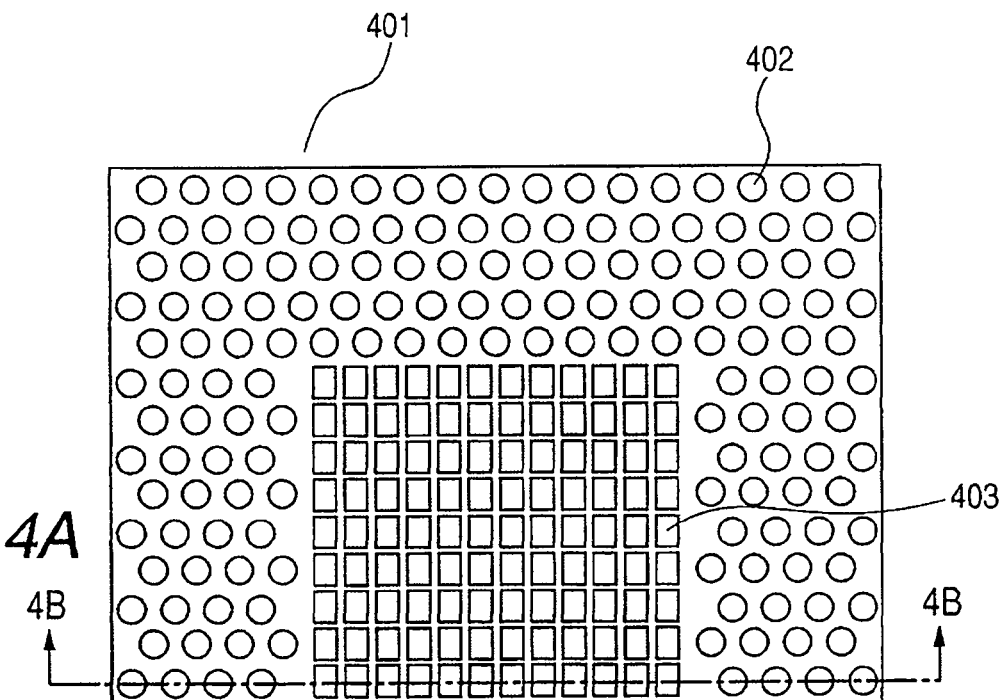
FIGS. 4A and 4B are a diagram showing structure of a photonic crystal slab, which is located at the topmost part of a vertical emitting laser, in the second example of the present invention with structure of a cross-section taken on line 4B-4B in FIG. 4A.
Figure 4B:
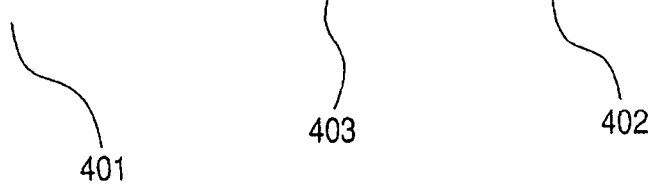

Reference numeral 301 denotes a two-dimensional photonic crystal slab which is constructed of GaAs, and while it is an active region, it functions also as a reflecting mirror. Reference numerals 302 and 303 denote cylindrical holes. In addition, FIGS. 4A and 4B show structure of a photonic crystal slab, which is located at the topmost part of a vertical emitting laser, in the second example with structure of a cross-section taken on line 4B-4B. Reference numeral 401 denotes a two-dimensional photonic crystal slab which is constructed of a GaInNAs QW/GaAs active layer. Reference numeral 402 denotes cylindrical holes and reference numeral 403 denotes square holes. In addition, FIG. 5 shows structure of the vertical emitting laser in the second example.

As shown in FIG. 5, the vertical emitting laser of this example comprises a cladding layer 502 which is constructed of AlAs on a GaAs substrate 501, and comprises the two-dimensional photonic crystal slab 301, which is constructed of GaAs, on its upper portion as a reflecting mirror. Thereon, the vertical emitting laser comprises a spacer 503 which is constructed of AlAs for securing a predetermined distance, and the two-dimensional photonic crystal slab 401 which has quantum well structure of GaInNAs/GaAs which emits light on a wavelength of nearly 1.3 μm at a topmost part.

The photonic crystal slab 301 of this example comprises a two-dimensional photonic crystal which is constructed of cylindrical holes, in parallel to its face as shown in FIGS. 3A and 3B. Structure of the photonic crystal near a center is made different from structure of the photonic crystal surrounding it. A diameter of a cylindrical hole 302 of the photonic crystal near the center differs from a diameter of a cylindrical hole 303 of the photonic crystal surrounding it. This example is designed so that a wavelength band of light contributing to light emission and oscillation may become within a photonic band gap of the photonic crystal surrounding this. Thereby, light which is incident into near the center is blocked by the photonic crystal surrounding the vicinity of the center in a two-dimensional direction in its face not to be emitted outside. Hence, it is possible to suppress loss. It is possible to operate this photonic crystal slab 301 as a reflecting mirror using the principle similar to that of the reflection of light in the photonic crystal in the first example.

In addition, the photonic crystal slab 401 arranged at the topmost part of the vertical emitting laser in FIG. 5 has structure as shown in FIGS. 4A and 4B. Thus, the photonic crystal slab 401 comprises a two-dimensional photonic crystal in a shape of a square lattice which is constructed of rectangular holes 403 near a center, and a photonic crystal 403, which is constructed of cylindrical holes 402 which block its handling light by a photonic band gap effect, around it similarly to FIGS. 3A and 3B. Thereby, it is possible to suppress loss of light in a two-dimensional direction since the light which can exist near the center is blocked by the surrounding photonic crystal.

This example has structure of replacing the DBR 202 in first example with the photonic crystal slab 301, which is the reflecting mirror, as structure. Hence, it is possible to use the principle similar to that in the first example for process of laser oscillation. However, since the square holes 403 which form the photonic crystal near the center which is provided in the photonic crystal slab 401 concerning to optical amplification are rectangular in this example, it is possible thereby to control polarization of light to be emitted. In this way, according to the vertical emitting laser of this example, it is possible to materialize a highly efficient laser where modes are aligned in a large area where polarization is controlled.

Example 3

In a third example of the present invention, a vertical emitting laser which operates by current injection with applying the above-mentioned present invention is constructed. FIGS. 6A and 6B show structure of a photonic crystal slab in this example with a cross-section taken on line 6B-6B. FIG. 7 shows structure of the vertical emitting laser in this example. The vertical emitting laser which operates by the current injection of this example is constructed so as to be given electron injection after provision of an n-electrode 702 which is constructed of Au/Ge/Ni/Au formed by spattering in a portion on an n-GaAs substrate 701 as shown in FIG. 7. In addition, the vertical emitting laser comprises an n-DBR 703, where 35 periods of GaAs/AlGaAs with Si being doped are laminated, as a reflecting mirror on the n-GaAs substrate 701. Furthermore, a spacer 705 which is constructed of n-AlGaAs is provided thereon. A two-dimensional photonic crystal slab 601 which is constructed of an active material including a multiple quantum well of AlGaAs/GaAs is formed on the spacer 705. Further, a cladding layer 704 which is constructed of p-AlGaAs is provided thereon.

Since a p-electrode 706 with structure of Ti/Pt/Au is provided in a topmost part, it is possible to inject holes. In addition, the p-electrode 706 has a shape that a large portion of a center part is hollowed, and hence, it is possible to use the hollowed portion as an emission window 707.

The two-dimensional photonic crystal slab 601 is shown in FIGS. 6A and 6B. It is formed by arraying cylindrical holes in a face in a shape of a square lattice. A region corresponding to the emission window inside a circle 604 becomes a photonic crystal which is constructed of cylindrical holes 603, and the external of the circle 604 is a photonic crystal which is constructed of cylindrical holes 602.

Light on wavelengths in modes which is handled in this example can exist in the photonic crystal inside the circle 604. However, it is designed so that the light cannot exist because of the photonic band gap effect in the photonic crystal outside the circle 604. It, is possible to prevent light from leaking in a direction parallel to a face by this.

In addition, a high resistance region 605 outside the circle 604 of the photonic crystal slab 601 is oxidized to have extremely high resistance, but a low resistance area 606 inside the circle 604 has low resistance. Therefore, when flowing a current through a vertical direction (direction perpendicular to a face) of the vertical emitting laser of this example, it is possible to flow a current efficiently into the circle 604 concerned to light emission and amplification. Thereby, holes and electrons are efficiently injected into the inside of the circle 604 from its vertical direction, and they recombine in the region of the quantum well structure. Although an excitation method differs from those in the first example and second example, the fundamental oscillation principle as a laser is based on the similar idea to that in the first example and second example.

In the two-dimensional photonic crystal slab 601, light emission with a wavelength of 850 nm as a center wavelength because of current injection occurs. Light in a standing wave state in modes aligned in a two-dimensional face couples with external light, and is emitted in a direction perpendicular to the face to reach the n-DBR 703. Almost all of the light is reflected by the n-DBR and is again converted into the two-dimensional mode of the two-dimensional photonic crystal slab 601. Induced emission occurs in the crystal of the two-dimensional photonic slab 601 by this repetition. Then, laser oscillation occurs in a cavity constructed of the two-dimensional photonic crystal slab 601, spacer 705, and n-DBR 703 for a part of laser light to be taken out in a direction perpendicular to the face through the emission window 707. In this way, according to the vertical emitting laser of this example, it is possible to materialize a laser that quantum efficiency is high and modes in a face are well aligned.

Example 4

Figure 9:
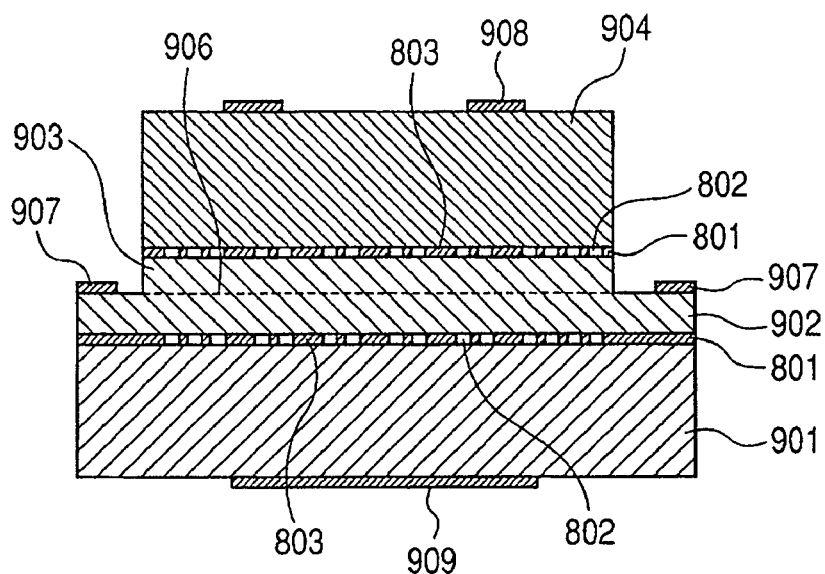
FIG. 9 is a diagram showing structure of a vertical emitting laser in the fourth example of the present invention.

FIGS. 8A and 8B shows structure of a photonic crystal slab in this example with structure of a cross-section taken on line 8B-8B. In addition, FIG. 9 shows structure of a vertical emitting laser in this example. The vertical emitting laser which operates by current injection comprises a two-dimensional photonic crystal slab which has a multiple quantum well layer of InGaN/GaN which has a light emission peak of a band gap near a wavelength of 400 nm on n-GaN, as shown in FIG. 9. Furthermore, two units on which p-GaN thin film is provided are prepared, and both are bonded so that p-GaN layers may face mutually.

As structure, a two-dimensional photonic crystal slab 801 is arranged on n-GaN 901, and a p-GaN layer 902 and a p-GaN layer 903 are provided on it. Then, a two-dimensional photonic crystal slab 801 is provided on it, and n-GaN 904 is again provided on it. The bonded surface of two p-GaN layers 902 and 903 is shown by a dotted line as a bonded face 906.

In addition, by enlarging an area around the photonic crystal of one unit, it becomes possible to arrange a p-electrode 907 and to inject a hole current into the two two-dimensional photonic crystal slabs. Furthermore, since a p-electrode for injecting electrons is provided on a face of the n-GaN 901 and 904, it is possible to inject electrons into the two two-dimensional photonic crystal slabs. Although two of two-dimensional photonic crystal slabs differ mutually in size, structures and materials of the photonic crystals are similar, and the two-dimensional photonic crystal slabs are shown in FIGS. 8A and 8B as photonic crystal slabs 801.

The photonic crystal formed in the photonic crystal slab 801 is formed by arraying the cylindrical holes 802 in a shape of a square lattice. Hence, the light with wavelengths and modes which is handled in this example exists in the photonic band gap of this photonic crystal, or can hardly exist. However, as shown inside the circle 804 in the figure, the photonic crystal has structure that defects 803 which each are a region in which the cylindrical hole 802 lacks are arrayed periodically.

When the number of defects 803 is one, it functions independently as a point defect. But since more than one are periodically arranged at certain intervals as shown in the figure, modes of a plurality of defects are coupled mutually. Hence, only the light with wavelengths and modes which correspond to the defect-coupled mode caused by the coupling of modes of the plurality of defects among luminous wavelengths from the active material in the photonic band gap can exist in the photonic crystal. It is possible to generate light, where modes are aligned, in a large area within the photonic crystal face by the coupled mode.

In addition, the following functions are achieved by designing a photonic crystal so as to be easy to couple light, corresponding to this coupled mode, with external light.

Thus, the light in the modes which are aligned in the face and correspond to the coupled mode is emitted mainly in a direction perpendicular to the face. Hence, it is possible to operate it like a reflecting mirror which reflects light in the same mode that is incident into the face from the external. When being formed in this way, the photonic crystal slab 801 comprises an active region. Hence, while operating like a reflecting mirror, it is possible to cause amplification of the light in this mode when it is in an excitation state.

The vertical emitting laser shown in FIG. 9 has the structure of facing the photonic crystal slabs with such an optical amplification action by performing current injection from the p-electrode and n-electrode. Therefore, whenever reflection occurs on both two photonic crystals 801, optical amplification is performed, and hence, it is possible to achieve a highly efficient laser. A standing wave is formed also in a direction perpendicular to the face by using as a cavity a region constructed of both the two-dimensional photonic crystals 801, and p-GaN 902 and 903. Hence, laser light is emitted outside through the window.

Example 5

Figure 13:
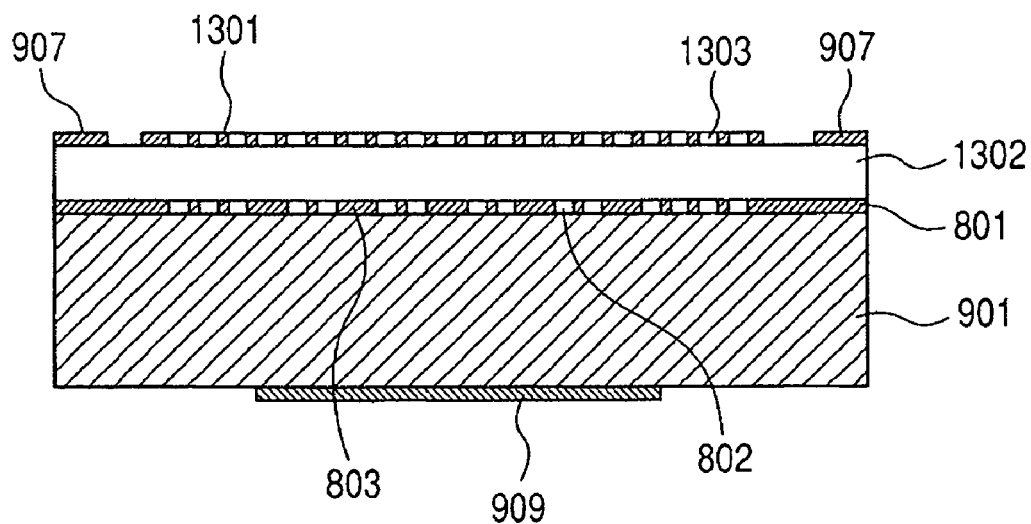
FIG. 13 is a diagram showing structure of a vertical emitting laser of a fifth example according to the present invention.

FIG. 13 shows structure of a vertical emitting laser in this example. In the vertical emitting laser of this example, as shown in FIG. 13, a two-dimensional photonic crystal slab 1301 using a nonlinear crystal is used as an upper unit with smaller size between two of the two-dimensional photonic crystal slabs in the above-mentioned fourth example. Thereby, a small light-transforming element is achieved. The two-dimensional photonic crystal slab 1301 has a photonic crystal which is constructed of cylindrical holes. Structure of the photonic crystal is designed so that light which is incident and is converted into a two-dimensional mode may be given phase matching by periodical structure of the photonic crystal and may be converted into SHG (second harmonic wave) light. Laser oscillation is performed within a cavity constructed of two photonic crystal slabs 801 and 1301, and a spacer 1302. When SHG light is described as light in an emission mode in photonic band structure, it is emitted to the external from a face. Since the emitted SHG light is transmitted without being reflected by another two-dimensional photonic crystal slab 801 which is constructed of an active material, it is possible to take out the emitted SHG light to the external. Thus, it is possible to materialize a laser with a wavelength conversion function.

Example 6

Gain Distribution

Figure 19A:
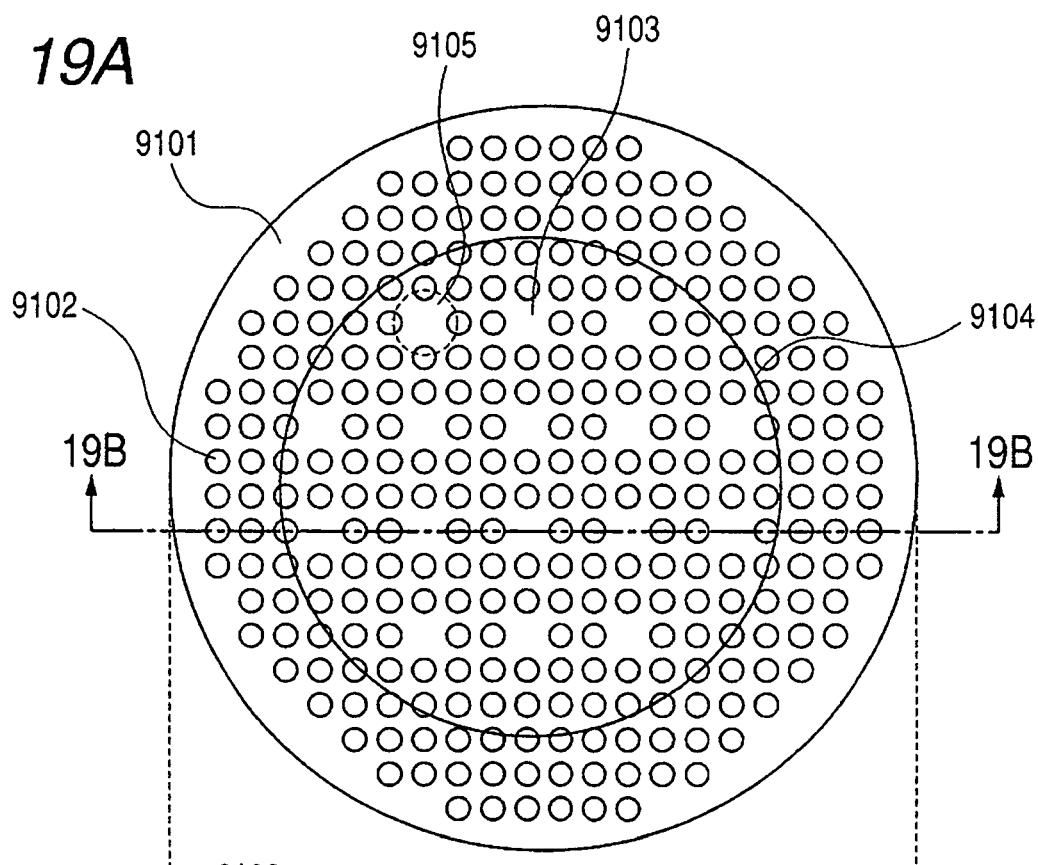
FIGS. 19A and 19B are a schematic diagram for explaining an embodiment of the present invention.
Figure 19B:
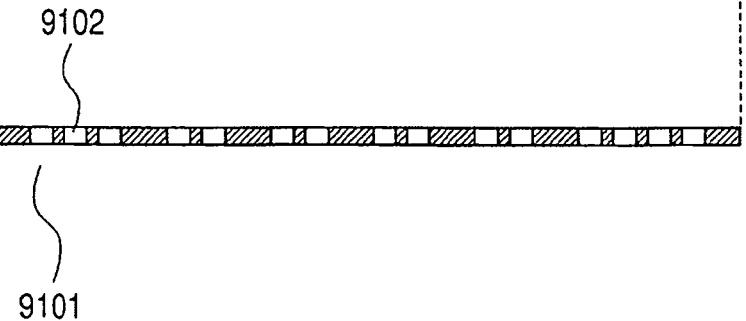

An example of the vertical emitting laser as a sixth example of the present invention which operates by the current injection is shown in FIGS. 19A and 19B. In the vertical emitting laser shown in FIG. 20, a dielectric multilayer film 2205 of 70 layers of GaN/AlGaN which has a reflective band on a wavelength of nearly 400 nm on n-GaN 2201 is formed. An n-GaN layer 2202 and an n-GaN layer 2203 are provided on it, and a two-dimensional photonic crystal slab 2101 which has a multiple quantum well layer of InGaN/GaN which has a light emission peak of a band gap on a wavelength of nearly 400 nm is provided on it. Further, thereon, p-GaN 2204 is provided. The bonded surface of two n-GaN layers 2202 and 2203 is shown by a dotted line as a bonded face 2206. Furthermore, since a p-electrode 2208 and an n-electrode 2209 for injecting holes and electrons respectively are provided on faces of the p-GaN 2204 and n-GaN 2201, it is possible to inject carriers into the two two-dimensional photonic crystal slab 2101. The two-dimensional photonic crystal slab 2101 is shown in FIGS. 19A and 19B. As for a photonic crystal formed in a photonic crystal slab 9101, cylindrical holes 9102 are arranged in a shape of a square lattice, and hence, light with wavelengths and modes which is handled in this example exists in the photonic band gap of this photonic crystal, or can hardly exist. However, as shown inside the circle (region) 9104 in the figure, the photonic crystal has structure that defects 9103 which each are a region in which the cylindrical hole 9102 lacks are arrayed periodically. When the number of defects 9103 is one, it functions independently as a point defect. But since more than one are periodically arranged at certain intervals as shown in the figure, modes of a plurality of defects are combined mutually. Hence, only the light with wavelengths and modes which correspond to the defect-coupled mode caused by the coupling of modes of the plurality of defects among luminous wavelengths from the active material in the photonic band gap can exist in the photonic crystal. It is possible to generate light, where modes are aligned, in a large area within the photonic crystal face by the coupled mode. In addition, the photonic crystal is designed so as to be easy to couple light, corresponding to this coupled mode, with external light. Thereby, the light in the modes which are aligned in the face and correspond to the coupled mode is emitted mainly in a direction perpendicular to the face. Hence, it is possible to operate it like a reflecting mirror which reflects light in the same mode that is incident into the face from the external. When being formed in this way, the photonic crystal slab 9101 also comprises an active region. Hence, while operating like a reflecting mirror, it is possible to cause amplification of the light in this mode when it is in an excitation state.

Furthermore, gain distribution is controlled in this example so that a gain is distributed only to a region 9105 near defects of the photonic crystal by proton injection. Thereby, light emission occurs efficiently only around the defectives 9103 in which light is mainly confined, and hence, it is possible to materialize a device which is highly efficient, and in which modal control is performed.

Example 7

An example of a surface emitting laser of the present invention will be explained as a seventh example using GIG. 15.

The vertical emitting laser in GIG. 15 comprises a cladding layer 502 which is constructed of AlAs on a GaAs substrate 501, and comprises a two-dimensional photonic crystal slab 301, which is constructed of GaAs, on its upper portion as a reflecting mirror.

Figure 18:
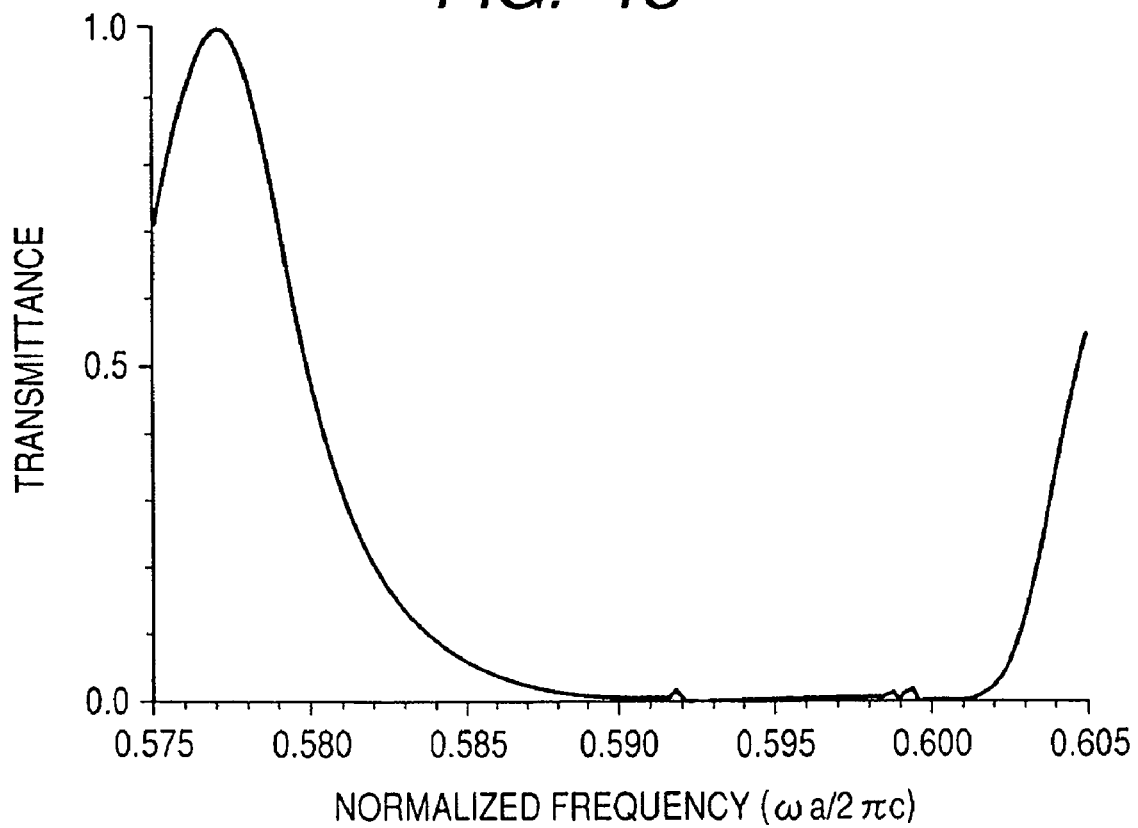
FIG. 18 is a schematic diagram for explaining an embodiment of the present invention.

Thereon, the surface emitting laser comprises a spacer 503, which is constructed of AlAs, for securing a predetermined distance, and an active layer 504, which is constructed of GaInNAs and emits light on a wavelength of nearly 1.3 μm, in a central part of the spacer 503. The surface emitting laser comprises on a topmost part a two-dimensional photonic crystal slab 401 which has quantum well structure of GaInNAs/GaAs. The photonic crystal slab 301 comprises a two-dimensional photonic crystal which is constructed of cylindrical holes, in parallel to its face as shown in FIGS. 3A and 3B. Structure of the photonic crystal near a center is made different from structure of the photonic crystal surrounding it. A diameter of a cylindrical hole 302 of the photonic crystal near the center differs from a diameter of a cylindrical hole 303 of the photonic crystal surrounding it. This example is designed so that a wavelength band of light contributing to light emission and oscillation may become within a photonic band gap of the photonic crystal surrounding this. Thereby, light which is incident into near the center is blocked by the photonic crystal surrounding the vicinity of the center in a two-dimensional direction in its face not to be emitted outside. Hence, it is possible to suppress loss. It is possible to operate this photonic crystal slab 301 as a reflecting mirror using the principle similar to that of the reflection of light in the photonic crystal in the first example. In addition, the photonic crystal slab 401 arranged at the topmost part of the vertical emitting laser in GIG. 15 has structure as shown in FIGS. 21A and 21B. The photonic crystal slab 401 comprises a two-dimensional photonic crystal in a shape of a square lattice, which is constructed of rectangular holes 403, near a center, and a photonic crystal 403 which is constructed of cylindrical holes 402 which block its handling light by a photonic band gap effect, around it similarly to FIGS. 3A and 3B. Thereby, it is possible to suppress loss of light in a two-dimensional direction since the light which can exist near the center is blocked by the surrounding photonic crystal. In addition, a region surrounded by a dotted line in FIGS. 21A and 21B is a gain region 405, and light emission outside this gain region 405 is suppressed. Hence, it is possible to suppress unnecessary spontaneous emission, leakage of carriers, and the like. Similarly, as for the active layer 504, a gain is given only near a central portion of the face. The photonic crystal slab 301 in the square lattice which functions as a reflecting mirror in a face vertical direction is designed by calculation such that thickness is about 370 nm, a grating constant is 770 nm, and a radius of a hole is about 310 nm. The photonic crystal slab 301 exerts reflection property in a wavelength band as shown in FIG. 18. In FIG. 18, ω denotes an angular frequency of light, a denotes a grating constant of a photonic crystal, and c denotes velocity of light in vacuum.

This example has structure of replacing the DBR in the sixth example with the photonic crystal slab 301, which is the reflecting mirror, as structure. Hence, it is possible to use the principle similar to that in the sixth example for process of laser oscillation.

However, since the square holes 403 which form the photonic crystal near the,-center which is provided in the photonic crystal slab 401 concerning to optical amplification are rectangular in this example, it is possible to control polarization of light to be emitted. In this way, according to the surface emitting laser of this example, it is possible to materialize a highly efficient laser where modes are aligned in a wide area where polarization is controlled.

Example 8

Another Gain Layer in Spacer Region

Figure 14:
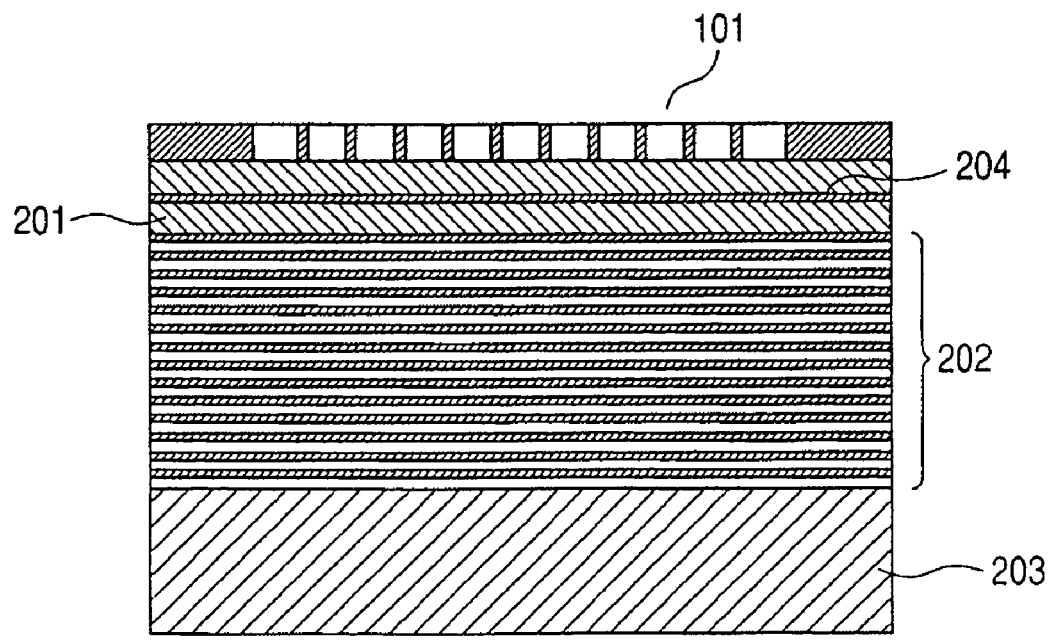
FIG. 14 is a schematic diagram for explaining an embodiment of the present invention.

The surface emitting laser is shown in FIG. 14 as an eighth example of the present invention. A distributed Bragg reflector (DBR) 202 which is made of laminating 30 periods of AlGaInAs/InP thin films by crystal growth technology on an InP substrate 203, and a spacer which is constructed of InAlAs is arranged thereon.

An active layer 204 which is constructed of AlGaInAs is formed into the spacer 201. Furthermore, a photonic crystal slab 101 with thickness of about 300 nm which has multiple quantum well (MQW) structure of AlGaInAs/InP near a center in a depth direction is formed on it. In this example, the photonic crystal slab 101 is the two-dimensional periodic structure, the DBR 202 is the reflecting mirror, and the active layer 204 is the active layer. In order to secure a predetermined distance in this specification, the spacer 201 at about 440 nm thick is provided. The photonic crystal slab 101 is the same as that in the first example. When a function as a gain medium is insufficient at the time of only the photonic crystal slab 101, it is possible to compensate it by further providing the active layer 204 as shown in this example.

Example 9

Figure 15:
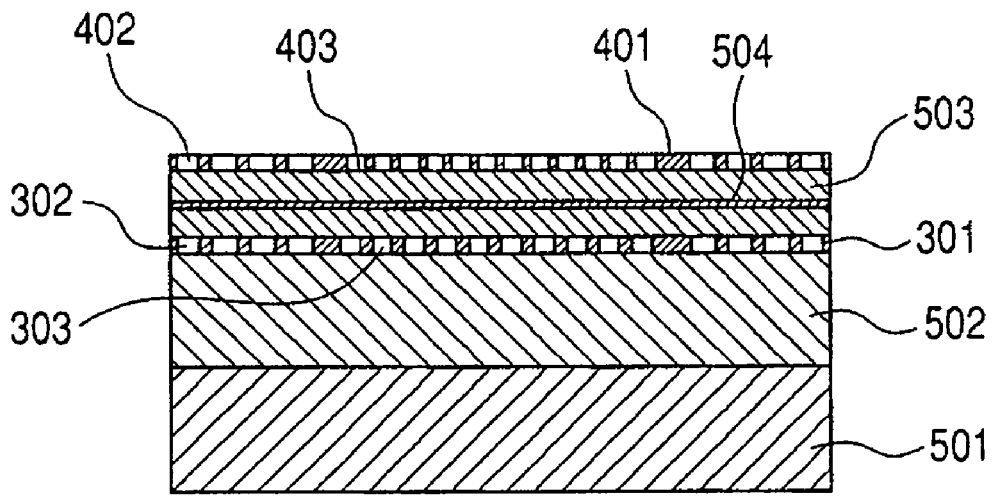
FIG. 15 is a schematic diagram for explaining an embodiment of the present invention.

An example of a surface emitting laser of the present invention will be explained as a ninth example using FIG. 15. The surface emitting laser in FIG. 15 comprises a cladding layer 502 which is constructed of AlAs on a GaAs substrate 501, and comprises a two-dimensional photonic crystal slab 301, which is constructed of GaAs, on its upper portion as a reflecting mirror. Thereon, the surface emitting laser comprises a spacer 503, which is constructed of AlAs, for securing a predetermined distance, and an active layer 504, which is constructed of GaInNAs and emits light on a wavelength of nearly 1.3 μm, in a central part of the spacer 503. The surface emitting laser comprises on a topmost part a two-dimensional photonic crystal slab 401 which has quantum well structure of GaInNAs/GaAs. The photonic crystal slab 301 is as shown in FIGS. 4A and 4B, and is the same as that in the second example. In addition, the photonic crystal slab 401 arranged at the topmost part of the vertical emitting laser in FIG. 15 is as shown in FIGS. 4A and 4B. The photonic crystal slab 401 comprises a two-dimensional photonic crystal in a shape of a square lattice, which is constructed of rectangular holes 403, near a center, and a photonic crystal 403 which is constructed of cylindrical holes 402 which block its handling light by a photonic band gap effect. Thereby, it is possible to suppress loss of light in a two-dimensional direction since the light which can exist near the center is blocked by the surrounding photonic crystal. The photonic crystal slab 301 in the square lattice which functions as a reflecting mirror in a face vertical direction is designed by calculation such that thickness is about 370 nm, a grating constant is 770 nm, and a radius of a hole is about 310 nm. This example has structure of replacing the DBR 202 in the eighth example with the photonic crystal slab 301, which is the reflecting mirror, as structure. Hence, it is possible to use the principle similar to that in the eighth example for process of laser oscillation. However, since the square holes 403 which form the photonic crystal near the center which is provided in the photonic crystal slab 401 concerning to optical amplification are rectangular in this example, it is possible to control polarization of light to be emitted. In this way, according to the surface emitting laser of this example, it is possible to materialize a highly efficient laser where modes are aligned in a wide area where polarization is controlled. In FIG. 15, reference numeral 504 denotes a QW active layer used as a gain region provided in the spacer layer 503.

Example 10

Figure 16:
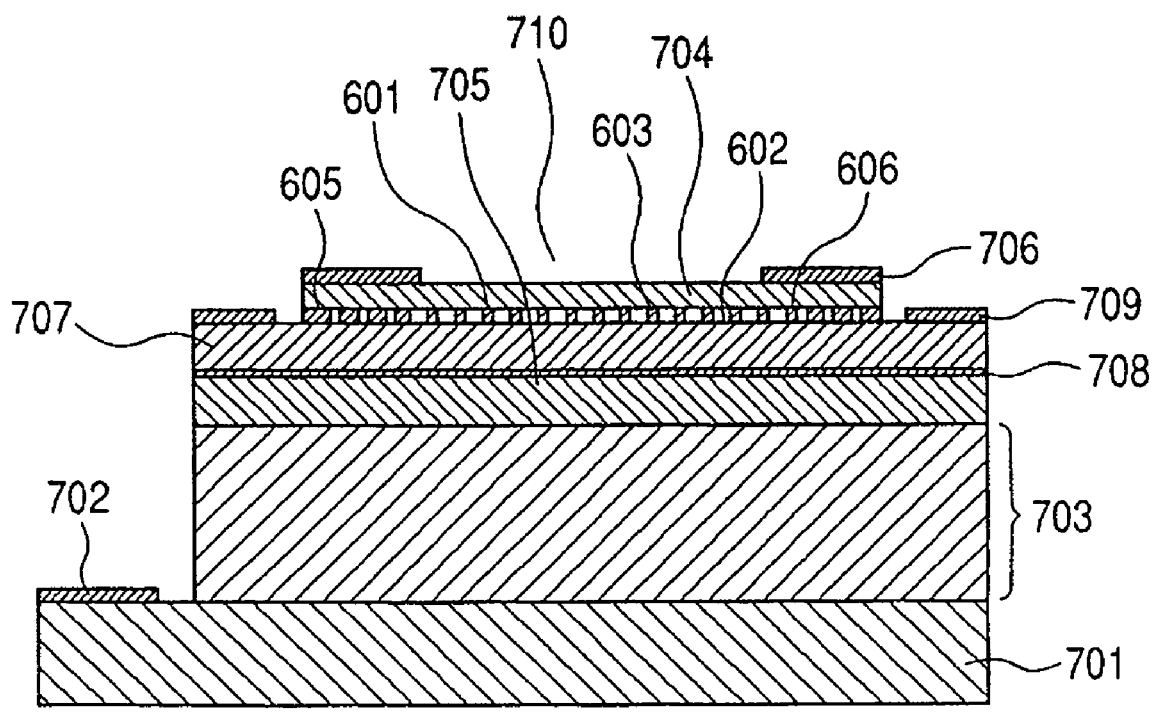
FIG. 16 is a schematic diagram for explaining an embodiment of the present invention.

An example of the surface emitting laser of the present invention which operates by the current injection is shown in FIG. 16 as a tenth example. In FIG. 16, an n-electrode 702 which is constructed of Au/Ge/Ni/Au formed by spattering in a portion on the n-GaAs substrate 701 is provided, and electrons are injected. In addition, the surface emitting laser comprises the n-DBR 703, where 35 periods of GaAs/AlGaAs with Si being doped are laminated, as a reflecting mirror on the n-GaAs substrate 701. Furthermore, the spacer 705 which is constructed of n-AlGaAs is provided thereon. By providing an active layer, which is constructed of AlGaAs which is an active material, on the spacer 705 and further growing a spacer 707, which is constructed of p-AlGaAs, it is possible to form a PN junction with sandwiching the active layer 708, and to inject electrons and holes into the active layer 708. Thereon, the two-dimensional photonic crystal slab 601 which is constructed of an active material including a multiple quantum well of AlGaAs/GaAs is formed. Further, the cladding layer 704 which is constructed of n-AlGaAs is provided thereon. Since an n-electrode 706 with structure of Au/Ge/Ni/Au is provided in a topmost part, it is possible to inject electrons. In addition, the n-electrode 706 has a shape that a large portion of a center part is hollowed, and hence, it is possible to use the hollowed portion as an emission window 710. Furthermore, a p-electrode 709 is formed so as to inject holes. The two-dimensional photonic crystal slab 601 is shown in FIGS. 6A and 6B. The two-dimensional photonic crystal slab 601 is formed by arraying cylindrical holes in a face in a shape of a square lattice. A region corresponding to the emission window inside the circle 604 becomes a photonic crystal which is constructed of cylindrical holes 603, and the external of the circle 604 is a photonic crystal which is constructed of cylindrical holes 602. It is designed that light on wavelengths in modes which is handled in this example can exist in the photonic crystal inside the circle 604, but does not exist in the photonic crystal outside the circle 604. It is possible to prevent light from leaking in a direction parallel to a face by this. A grating constant of the photonic crystal near a center which operates as a reflecting mirror is about 500 nm, a radius of a hole is about 200 nm, and thickness of the photonic crystal slab 601 is about 240 nm. In addition, the high resistance region 605 outside the circle 604 of the photonic crystal slab 601 is oxidized to have extremely high resistance. On the other hand, the low resistance region 606 inside the circle 604 has low resistance. Hence, when flowing a current through a vertical direction (direction perpendicular to a face) of the vertical emitting laser of this example, it is possible to flow a current efficiently into the circle 604 concerned to light emission and amplification. Furthermore, a peripheral part is oxidized in an in-plane direction parallel to the face of the photonic crystal slab 601 over the whole device. Thereby, holes and electrons are efficiently injected into the inside of the circle 604 from its vertical direction, and they recombine in the region of the quantum well structure. Although an excitation method differs from those in the eighth example and ninth example, the fundamental oscillation principle as a laser is based on the similar idea to that in the eighth example and ninth example. In the two-dimensional photonic crystal slab 601, light emission with a wavelength of 850 nm as a center wavelength because of current injection occurs. Light in a standing wave state in modes aligned in a two-dimensional face combines with external light, and is emitted in a direction perpendicular to the face to reach the n-DBR 703. Almost all of the light is reflected by the n-DBR and is again converted into the two-dimensional mode of the two-dimensional photonic crystal slab 601. Induced emission occurs in the crystal of the two-dimensional photonic slab 601 by this repetition, and laser oscillation occurs within a cavity constructed of the two photonic crystal slab 601, spacer 705, and n-DBR 703. A part of laser light is taken out in a direction perpendicular to the face through the emission window 710. In this way, according to the surface emitting laser of this example, it is possible to materialize a laser that quantum efficiency is high and modes in a face are well aligned.

Example 11

Figure 17:
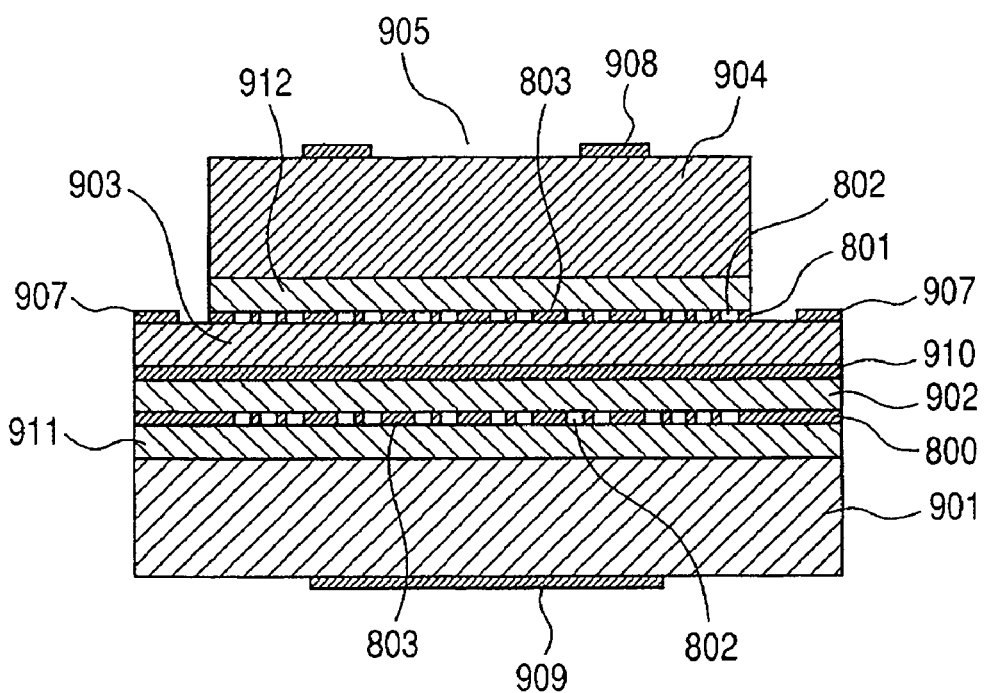
FIG. 17 is a schematic diagram for explaining an embodiment of the present invention.

An example of a surface emitting laser of the present invention which operates by the current injection is shown in FIG. 17 as an eleventh example. The surface emitting laser shown in FIG. 17 comprises an n-AlGaN 906 at thickness of about 1 μm grown on an n-GaN substrate, and a two-dimensional photonic crystal slab 800 which is constructed of n-GaN on it. A spacer which is constructed of n-AlGaN 902 and p-AlGaN 903 is further formed on the two-dimensional photonic crystal slab 800, and an active layer 910 which is constructed of InGaN is formed in a central part of the spacer. A two-dimensional photonic crystal slab 801 where cylindrical holes are formed in a GaN thin film which has a multiple quantum well layer of InGaN/GaN which has a light emission peak of a band gap on a wavelength of nearly 400 nm is provided on the p-AlGaN. Furthermore, an n-AlGaN thin film 911 and n-GaN 904 are formed on it. Since an n-electrode 909, a p-electrode 907, and an n-electrode 908 are arranged for carrier injection, it is possible to inject electrons and holes into the two-dimensional photonic crystal slab 801 and active layer 910.

Although two of the two-dimensional photonic crystal slabs 801 and 800 differ mutually in size, structures of the photonic crystals are almost similar, and wavelength bands of light which both reflect are almost similar. The two-dimensional photonic crystal slab 801 is shown in FIGS. 8A and 8B. The photonic crystal formed in the photonic crystal slab 801 is constructed of arraying the cylindrical holes 802 in a shape of a square lattice. The light with wavelengths and modes which is handled in this example exists in the photonic band gap of this photonic crystal, or can hardly exist. However, as shown inside the circle 804 in the figure, the photonic crystal has structure that defects 803 which each are a region in which the cylindrical hole 802 lacks are arrayed periodically. When the number of defects 803 is one, it functions independently as a point defect. But since more than one are periodically arranged at certain intervals as shown in the figure, modes of a plurality of defects are combined mutually. Hence, only the light with wavelengths and modes which correspond to a defect-coupled mode caused by coupling of modes of the plurality of defects among luminous wavelengths from the active material in the photonic band gap can exist in the photonic crystal. It is possible to generate light, where modes are aligned, in a large area within the photonic crystal face by the coupled mode. In addition, the photonic crystal is designed so as to be easy to couple light, corresponding to this coupled mode, with external light. Thereby, the light in the modes which are aligned in the face and correspond to the coupled mode is emitted mainly in a direction perpendicular to the face. Hence, it is possible to operate it like a reflecting mirror which reflects light in the same mode that is incident into the face from the external. When being formed in this way, the photonic crystal slab 801 comprises an active region. Hence, while operating like a reflecting mirror, it is possible to cause amplification of the light in this mode when it is in an excitation state. In addition, the surface emitting laser of this example shown in FIG. 17 performs optical amplification by performing current injection from the p-electrode and n-electrode, whenever light passes through the active layer 910 and reflection occurs on the two-dimensional photonic crystal slab 801. Hence, it is possible to materialize a highly efficient laser. A standing wave is formed also in a direction perpendicular to the face by using as a cavity a region constructed of the two-dimensional photonic crystals 801 and 800, n-AlGaN 902, p-AlGaN 903, and active layer 910. Hence, laser light is emitted outside through the emission window 905.

In addition, the surface emitting laser according to the present invention is applicable also to a light source for a photosensitive drum which an image forming apparatus such as a copier has.

This application claims priority from Japanese Patent Application No. 2005-130718 filed on Apr. 28, 2005, which is hereby incorporated by reference herein.

What is claimed is:

1. A vertical resonator type surface emitting laser, comprising:
   a first reflecting mirror;
   a first active layer, in which a refractive index in an in-plane direction of the first active layer changes periodically so that the first active layer serves as a second reflecting mirror provided oppositely to the first reflecting mirror, wherein the first active layer comprises a high resistance region and a low resistance region of a lower resistance than the high resistance region;
   a second active layer provided between the first reflecting mirror and the second reflecting mirror, any refractive index of which does not change periodically;
   a first spacer layer provided between the first reflecting mirror and the second active layer; and
   a second spacer layer provided between the second active layer and the second reflecting mirror,
   wherein the first and second reflecting mirrors contribute to a vertical resonator function of the vertical resonator type surface emitting layer.

2. The vertical resonator type surface emitting laser according to claim 1, wherein an emission window for emitting laser light to an external area is provided in a two-dimensional periodic structure of the first active layer.

3. The vertical resonator type surface emitting laser according to claim 1, wherein a two-dimensional periodic structure of the first active layer has a defect that disturbs a periodicity of the two-dimensional periodic structure.

4. The vertical resonator type surface emitting laser according to claim 1, wherein the first reflecting mirror includes a dielectric multilayer film.

5. The vertical resonator type surface emitting laser according to claim 1, wherein the first reflecting mirror, or a region between the first active layer and the first reflecting mirror, includes a nonlinear optical material.

6. The vertical resonator type surface emitting laser according to claim 1, wherein the first active layer includes means making a gain distribution.

* * * * *